(12) United States Patent
Schreuder et al.

(10) Patent No.: US 12,386,273 B2
(45) Date of Patent: Aug. 12, 2025

(54) SUBSTRATE HOLDER, LITHOGRAPHIC APPARATUS AND METHOD

(71) Applicant: ASML NETHERLANDS B.V., Veldhoven (NL)

(72) Inventors: André Schreuder, Eindhoven (NL); Gijs Kramer, Nijmegen (NL); Ludolf Postma, Nijmegen (NL)

(73) Assignee: ASML NETHERLANDS B.V., Veldhoven (NL)

( * ) Notice: Subject to any disclaimer, the term of this patent is extended or adjusted under 35 U.S.C. 154(b) by 435 days.

(21) Appl. No.: 17/636,411

(22) PCT Filed: Jul. 7, 2020

(86) PCT No.: PCT/EP2020/069109
§ 371 (c)(1),
(2) Date: Feb. 18, 2022

(87) PCT Pub. No.: WO2021/032356
PCT Pub. Date: Feb. 25, 2021

(65) Prior Publication Data
US 2022/0283505 A1 Sep. 8, 2022

(30) Foreign Application Priority Data

Aug. 20, 2019 (EP) .................................... 19192576
Dec. 20, 2019 (EP) .................................... 19219048

(51) Int. Cl.
*G03F 7/00* (2006.01)
*H01L 21/687* (2006.01)

(52) U.S. Cl.
CPC .......... *G03F 7/707* (2013.01); *G03F 7/70525* (2013.01); *H01L 21/6875* (2013.01)

(58) Field of Classification Search
CPC . G03F 7/707; G03F 7/70525; H01L 21/6875; H01L 21/68735; H01L 21/687; H01L 21/68714
See application file for complete search history.

(56) References Cited

U.S. PATENT DOCUMENTS 6,952,253 B2 10/2005 Lof et al.
8,659,741 B2 2/2014 De Graaf et al.
(Continued)

FOREIGN PATENT DOCUMENTS

CN 101916050 12/2010
JP 4-64216 2/1992
(Continued)

OTHER PUBLICATIONS

Anonymous, "Active Tuning of the Wafer Edge Flatness Between Measurement and Exposure", Research Disclosure, Database No. 535021 (Nov. 2008).
(Continued)

*Primary Examiner* — Christopher J. Besler
(74) *Attorney, Agent, or Firm* — Pillsbury Winthrop Shaw Pittman LLP

(57) ABSTRACT

A substrate holder for supporting a substrate, a lithographic apparatus having the substrate holder and a method of supporting the substrate. The substrate holder includes a main body, a plurality of supporting pins, and a plate. The plate is positioned between a surface of the main body and a support surface formed by the plurality of supporting pins. The plate is actuatable in a direction along the plurality of supporting pins between the surface of the main body and the support surface. The substrate holder may also include a main body, a flexible member and a fixed member protruding from a surface of the main body. The flexible member defines an enclosed cavity therein and configured to form a seal with the substrate supported on the substrate holder. The
(Continued)

substrate holder is configured to reduce pressure in the enclosed cavity of the flexible member.

20 Claims, 9 Drawing Sheets

(56) References Cited

U.S. PATENT DOCUMENTS

| | | |
|---|---|---|
| 2005/0286032 A1 | 12/2005 | Lof et al. |
| 2006/0119817 A1 | 6/2006 | Marie Hennus et al. |
| 2007/0182943 A1 | 8/2007 | Goodwin et al. |
| 2008/0165331 A1 | 7/2008 | Jacobs et al. |
| 2008/0186460 A1 | 8/2008 | Auer-Jongepier et al. |
| 2009/0179366 A1 | 7/2009 | Herchen et al. |
| 2011/0013169 A1 | 1/2011 | Lafarre et al. |
| 2011/0116060 A1 | 5/2011 | Dziomkina et al. |
| 2011/0199592 A1 | 8/2011 | De Graff et al. |
| 2011/0228238 A1 | 9/2011 | Roset et al. |
| 2011/0292369 A1 | 12/2011 | Lafarre et al. |
| 2013/0077065 A1 | 3/2013 | Lafarre et al. |
| 2013/0146785 A1 | 6/2013 | Gilissen et al. |
| 2014/0091537 A1 | 4/2014 | Iizuka et al. |
| 2016/0225650 A1* | 8/2016 | Komine ............ H01L 21/68735 |
| 2017/0053822 A1 | 2/2017 | Ben Natan et al. |
| 2017/0363948 A1 | 12/2017 | Rops et al. |
| 2018/0107107 A1 | 4/2018 | Kramer et al. |
| 2018/0193983 A1 | 7/2018 | Ishino et al. |
| 2019/0080955 A1 | 3/2019 | Lee et al. |

FOREIGN PATENT DOCUMENTS

| | | |
|---|---|---|
| JP | 2013-004612 | 1/2013 |
| JP | 2016-143706 | 8/2016 |
| JP | 2019-114590 | 7/2019 |
| KR | 2007-0109005 | 11/2007 |
| KR | 2018-0069383 | 6/2018 |
| TW | 201632241 | 9/2016 |
| WO | 2008/156366 | 12/2008 |
| WO | 2017/102162 | 6/2017 |
| WO | 2017/137129 | 8/2017 |
| WO | 2017/086333 | 11/2017 |
| WO | 2019/064577 | 4/2019 |
| WO | 2019/163214 | 8/2019 |

OTHER PUBLICATIONS

International Search Report dated Oct. 9, 2020, issued in corresponding International Application No. (3 pgs.).
Written Opinion of the International Searching Authority dated Oct. 9, 2020, issued in corresponding International Application No. PCT/EP2020/069109 (6 pgs.).
Office Action dated Jun. 16, 2021, issued in corresponding Taiwanese Patent Application No. 109125042 with English translation (3 pgs.).
Office Action issued in Japanese Patent Application No. 2022506590, dated Aug. 22, 2024.

* cited by examiner

SUBSTRATE HOLDER, LITHOGRAPHIC APPARATUS AND METHOD

CROSS-REFERENCE TO RELATED APPLICATIONS

This application is the U.S. national phase entry of PCT Patent Application No. PCT/EP2020/069109, which was filed on Jul. 7, 2020, which claims the benefit of priority of European Patent Application number 19192576.7, which was filed on Aug. 20, 2019 and of European Patent Application number 19219048.6, which was filed on Dec. 20, 2019 and which are incorporated herein in their entireties by reference.

FIELD

The present invention relates to a substrate holder for supporting a substrate, a lithographic apparatus comprising the substrate holder, a method of supporting a substrate on the substrate holder, and a method of clamping a substrate on the substrate holder.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

As semiconductor manufacturing processes continue to advance, the dimensions of circuit elements have continually been reduced while the amount of functional elements, such as transistors, per device has been steadily increasing over decades, following a trend commonly referred to as "Moore's law". To keep up with Moore's law the semiconductor industry is chasing technologies that enable to create increasingly smaller features. To project a pattern on a substrate a lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm.

A lithographic apparatus may include an illumination system for providing a projection beam of radiation, and a support structure for supporting a patterning device. The patterning device may serve to impart the projection beam with a pattern in its cross-section. The apparatus may also include a projection system for projecting the patterned beam onto a target portion of a substrate.

In a lithographic apparatus the substrate to be exposed (which may be referred to as a production substrate) may be held on a substrate holder (sometimes referred to as a wafer table). The substrate holder may be moveable with respect to the projection system. The substrate holder usually comprises a solid body made of a rigid material and having similar dimensions in plan to the production substrate to be supported. The substrate-facing surface of the solid body may be provided with a plurality of projections (referred to as burls). The distal surfaces of the burls may conform to a flat plane and support the substrate. The burls can provide several advantages: a contaminant particle on the substrate holder or on the substrate is likely to fall between burls and therefore does not cause a deformation of the substrate; it is easier to machine the burls so their ends conform to a plane than to make the surface of the solid body flat; and the properties of the burls can be adjusted, e.g. to control clamping of the substrate to the substrate holder.

Production substrates may become distorted during the process of manufacturing devices, especially when structures with significant height, e.g. so-called 3D-NAND, are formed. Often substrates may become "bowl-shaped", i.e. are concave viewed from above, or "umbrella-shaped", i.e. convex viewed from above. For the purpose of the present disclosure the surface on which device structures are formed is referred to as the top surface. In this context, "height" is measured in the direction perpendicular to the nominal surface of the substrate, which direction may be referred to as the Z-direction. Bowl-shaped and umbrella-shaped substrates are, to a certain degree, flattened out when clamped onto a substrate holder, e.g. by partially evacuating the space between the substrate and substrate holder. However, if the amount of distortion, which is typically measured by the height difference between the lowest point on the surface of the substrate and the highest point on the surface of the substrate, is too great, various problems can arise. In particular, it may be difficult to clamp the substrate adequately, there may be excessive wear of the burls during loading and unloading of substrates and the residual height variation in the surface of the substrate may be too great to enable correct patterning on all parts of the substrate, especially close to the edges.

SUMMARY

An object of the present invention is to provide a substrate holder that enables effective pattern formation on a substrate. A substrate holder according to an embodiment may advantageously provide an alternative way of supporting a substrate.

In a first embodiment, there is provided a substrate holder for supporting a substrate, the substrate holder comprising a main body having a surface; a plurality of supporting pins connected to the surface of the main body at proximal ends of the plurality of supporting pins, wherein distal ends of the plurality of supporting pins form a support surface for a substrate; and a plate comprising a plurality of openings, the plate being positioned between the surface of the main body and the support surface, wherein all of the plurality of supporting pins connected to the surface of the main body have a corresponding opening in the plate, and wherein the plate is actuatable in a direction along the plurality of supporting pins between the surface of the main body and the support surface.

According to the first embodiment, there is also provided a method of supporting a substrate on the substrate holder of any of the preceding claims, the method comprising: providing a substrate on the support surface of the substrate holder; obtaining data relating to one or more of a shape of the substrate on the support surface, a pressure between the substrate and the surface of the main body, and/or a flow rate of fluid extracted from between the substrate and the surface of the main body; determining a preferred position of the plate between the surface of the main body and the support surface based on the obtained data; moving the plate in the direction along the plurality of supporting pins to the preferred position; and extracting fluid from a space between the plate and the substrate.

According to a second embodiment, there is provided a substrate holder for supporting a substrate, the substrate holder comprising: a main body having a surface facing the substrate when the substrate is supported on the substrate holder; a flexible member protruding from the surface of the main body and having a height, the flexible member defining an enclosed cavity therein and being configured to form a seal with an underside of the substrate in a first state; and a fixed member protruding from the surface of the main body and having a height; wherein in a second state, the substrate holder is configured to reduce a pressure in the enclosed cavity of the flexible member such that the substrate is supported on the substrate holder.

According to the second embodiment, there is also provided a method of clamping a substrate to a substrate holder, the method comprising: providing a substrate holder, the substrate holder comprising: a main body having a surface facing the substrate when the substrate is supported on the substrate holder; a flexible member protruding from the surface of the main body and having a height, the flexible member defining an enclosed cavity therein; and a fixed member protruding from the surface of the main body and having a height; providing a substrate on the substrate holder, wherein the flexible member contacts an underside of the substrate prior to clamping the substrate to the substrate holder; clamping the substrate to the substrate holder; and during clamping, reducing the pressure in the enclosed cavity of the flexible member such that the substrate is supported on the substrate holder.

According to the present invention, there is also provided a lithographic apparatus comprising the substrate holder.

Further embodiments, features and advantages of the present invention, as well as the structure and operation of the various embodiments features and advantages of the present invention, as well as the structure and operation of the various embodiments of the present invention, are described in detail below with reference to the accompanying drawings.

BRIEF DESCRIPTION OF THE DRAWINGS

Embodiments of the invention will now be described by way of example only, with reference to the accompanying schematic drawings in which corresponding reference symbols indicate corresponding parts, and in which.

The features shown in the figures are not necessarily to scale, and the size and/or arrangement depicted is not limiting. It will be understood that the figures include optional features which may not be essential to the invention. Furthermore, not all of the features of the substrate holder are depicted in each of the figures, and the figures may only show some of the components relevant for a describing a particular feature.

DETAILED DESCRIPTION

In the present document, the terms "radiation" and "beam" are used to encompass all types of electromagnetic radiation, including ultraviolet radiation (e.g. with a wavelength of 436, 405, 365, 248, 193, 157, 126 or 13.5 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
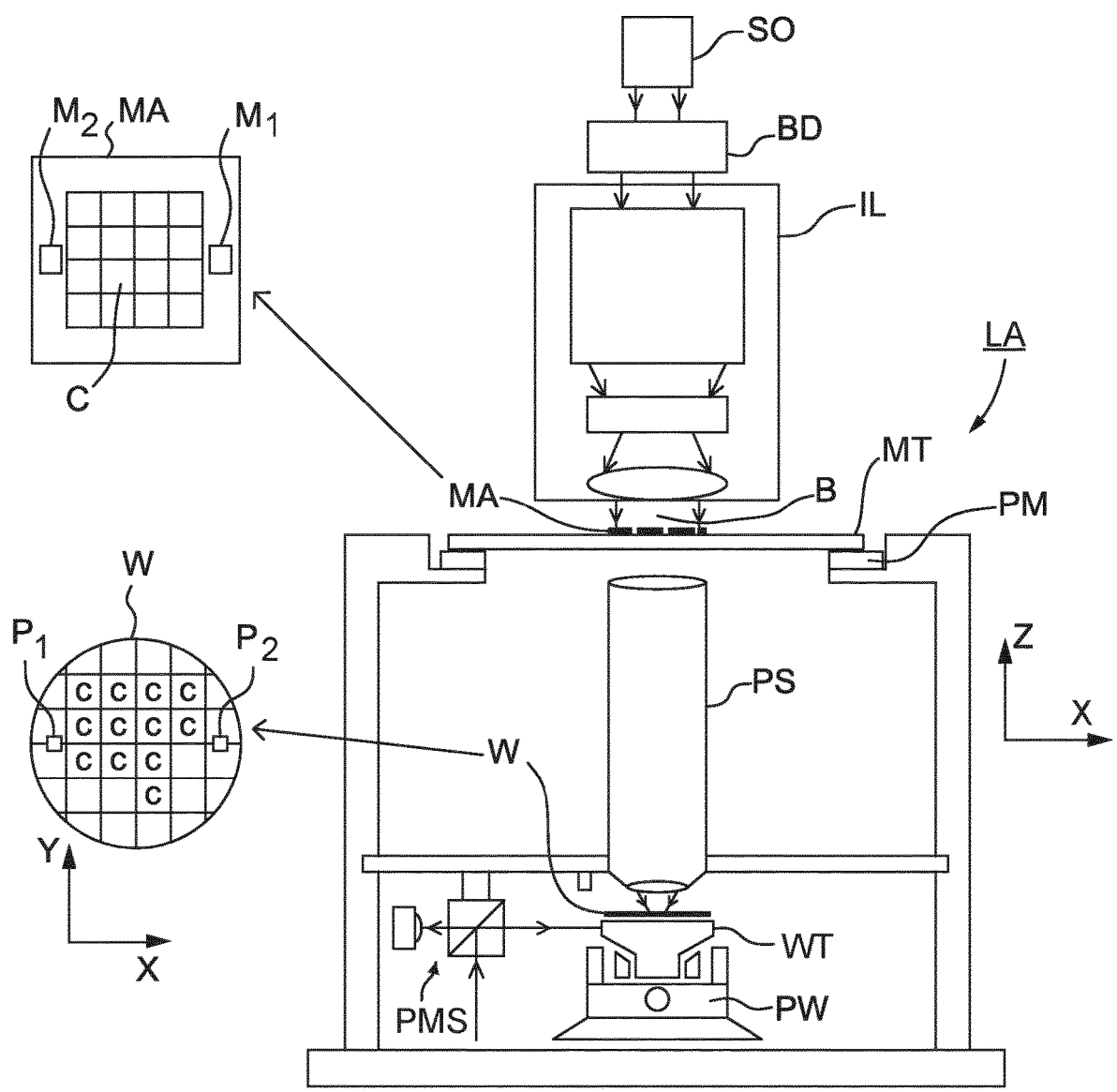
FIG. 1 schematically depicts an overview of a lithographic apparatus.

FIG. 1 schematically depicts a lithographic apparatus LA. The lithographic apparatus includes an illumination system (also referred to as illuminator) IL configured to condition a radiation beam B (e.g., EUV radiation or DUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a substrate table) WT constructed to hold a substrate (e.g., a resist coated wafer) W and connected to a second positioner PW configured to accurately position the substrate support WT in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives the radiation beam B from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus may be of a type wherein at least a portion of the substrate W may be covered by an immersion liquid having a relatively high refractive index, e.g., water, so as to fill an immersion space between the projection system PS and the substrate W— which is also referred to as immersion lithography. More information on immersion techniques is given in U.S. Pat. No. 6,952,253, which is incorporated herein by reference.

The lithographic apparatus may be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus may comprise a measurement stage (not depicted in FIG. 1). The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system PMS, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

In this specification, a Cartesian coordinate system is used. The Cartesian coordinate system has three axis, i.e., an x-axis, a y-axis and a z-axis. Each of the three axis is orthogonal to the other two axis. A rotation around the x-axis is referred to as an Rx-rotation. A rotation around the y-axis is referred to as an Ry-rotation. A rotation around about the z-axis is referred to as an Rz-rotation. The x-axis and the y-axis define a horizontal plane, whereas the z-axis is in a vertical direction. The Cartesian coordinate system is not limiting the invention and is used for clarification only. Instead, another coordinate system, such as a cylindrical coordinate system, may be used to clarify the invention. The orientation of the Cartesian coordinate system may be different, for example, such that the z-axis has a component along the horizontal plane.

In a lithographic apparatus it is necessary to position with great accuracy the upper surface of a substrate to be exposed in the plane of best focus of the aerial image of the pattern projected by the projection system. To achieve this, the substrate can be held on a substrate holder. The surface of the substrate holder that supports the substrate can be provided with a plurality of burls whose distal ends can be coplanar in a nominal support plane. The burls, though numerous, may be small in cross-sectional area parallel to the support plane so that the total cross-sectional area of their distal ends is a few percent, e.g. less than 5%, of the surface area of the substrate. The gas pressure in the space between the substrate holder and the substrate may be reduced relative to the pressure above the substrate to create a force clamping the substrate to the substrate holder.

It may be desirable to alter the control used to clamp a substrate to a surface of the substrate holder. This will be described in relation to a substrate holder which can be used to keep a substrate in a predetermined position, for example, during exposure of the substrate to radiation (i.e. when being patterned as described above).

As mentioned, it is desirable to increase the height of structures formed on a substrate. It has generally been found that distortion of a substrate positioned on a substrate holder tends to increase as the height of these structures increases, making reliable clamping of the substrate on the substrate holder more difficult.

The clamping can be made more reliable even taking the increased height into account. A first option is to increase the flow rate of fluid extracted beneath the substrate when the substrate is positioned on the substrate holder. A second option is the reduce the gap between the substrate and the substrate holder when in position on the substrate holder, i.e. by making the burls shorter. Both these options may improve the clamping when the substrate is in position on the substrate holder. However, both these options may have detrimental effects.

When a substrate is loaded onto a substrate holder, the substrate generally does not land perfectly flat on the substrate holder. This means that during loading of a substrate, one point of the substrate tends to make contact with at least one of the burls and then the rest of the substrate comes into contact with the substrate holder. Frictional forces between the substrate and the substrate holder during loading may lead to in-plane deformation in the substrate as the substrate makes contact across the substrate holder. The in-plane deformation can increase overlay errors. Both options described above for improving clamping may lead to increased in-plane deformation in the substrate, leading to greater overlay error.

Thus, although these options may improve clamping of the substrate, they can also lead to increased overlay errors which reduces throughput. The flow can be reduced for clamping the substrate to ameliorate the negative impact, but this increases the amount of time taken to clamp the substrate and thus, also decreases throughput. Additionally, the flow rate may affect substrates differently depending on how flat the substrate is during loading. Using a flow rate controller with different flow rate settings for different types of in-plane deformation could assist in dealing with different substrates but may be expensive.

To address at least some of the disadvantages of the prior art, a first embodiment provides a substrate holder for supporting a substrate. The substrate holder is configured to support the substrate. The substrate holder may hold the substrate in place. The substrate holder may be positioned on, or may be part of the substrate support WT described above, i.e., the substrate holder and the substrate support WT are made of a single piece. Further to this, the substrate holder may be configured to keep the substrate in place on the substrate holder in a particular position. For example, the substrate may be loaded onto the substrate during loading. The substrate holder may then be configured to keep the substrate in a fixed position relative to the substrate holder. This may otherwise be known as clamping the substrate.

Figure 2:
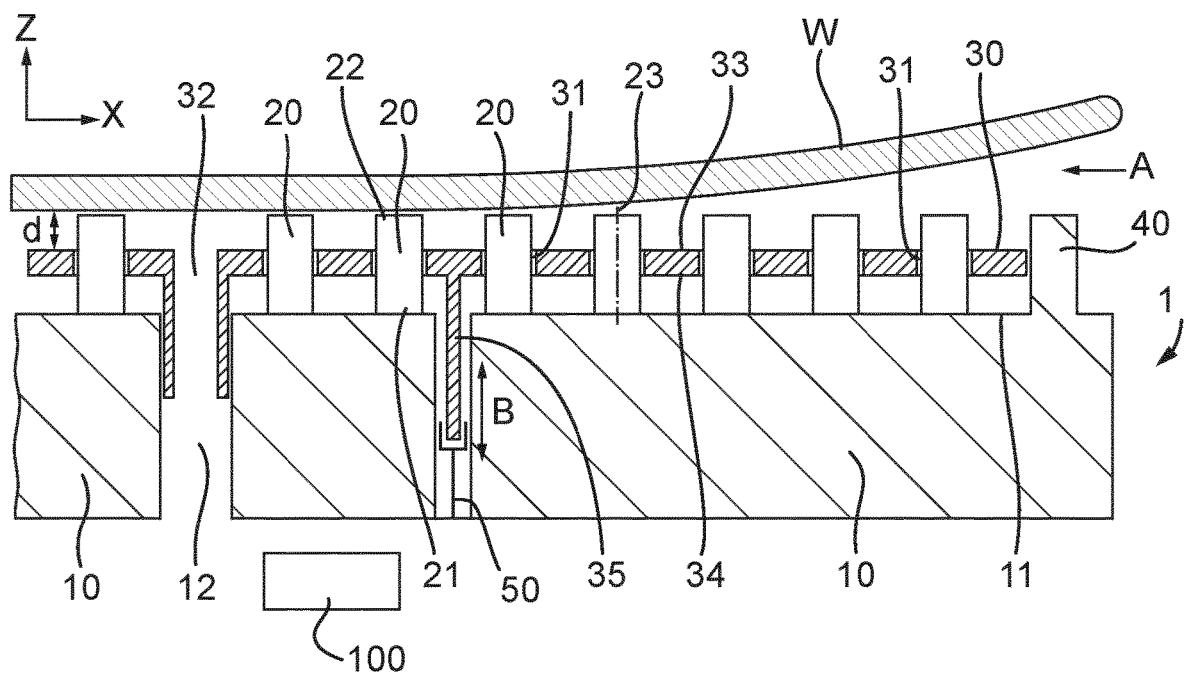
FIG. 2 depicts a cross section of part of a substrate holder according to a first embodiment.

A partial cross section of a substrate holder 1 according to a first embodiment is shown in FIG. 2. The substrate holder 1 comprises a main body 10 having a surface 11. The main body 10 may form a substantial portion of the substrate holder 1. The surface 11 may be a top surface of the main body 10 when positioned as shown in FIG. 2. Thus, the top surface may be an upper surface in the Z-direction as shown.

The substrate holder 1 comprises a plurality of supporting pins 20 connected to the surface 11 of the main body 10. The supporting pins 20 may otherwise be referred to as burls, as described above. The plurality of supporting pins 20 have proximal ends 21, which are situated near the main body 10 when in position, and distal ends 22. The distal ends 22 are at opposite ends of the plurality of supporting pins 20 to the proximal ends 21, i.e. are situated at an end of the supporting pin 20 away from the main body 10.

The plurality of supporting pins 20 have a central longitudinal axis 23, with the proximal end 21 at one end of the supporting pin 20 and the distal end 22 at the other end of the supporting pin 20 along the central longitudinal axis 23. Thus, each of the plurality of supporting pins 20 may have a central longitudinal axis 23 from the proximal end 21 to the distal end 22.

The distal ends 22 of the plurality of supporting pins 20 form a support surface for a substrate W. The distal ends 22 of the plurality of supporting pins 20 may be provided in a plane. Preferably, the support surface is formed in a substantially flat plane, i.e. the distal surfaces of the supporting pins 20 may conform to a flat plane and support the substrate W. This is beneficial as the substrate W can be positioned on the support surface to also be substantially flat, which can reduce errors when patterning the substrate W.

The substrate holder 1 further comprises a plate 30. The plate 30 is positioned between the surface 11 of the main body 10 and the support surface, i.e. formed by the distal ends 22 of the plurality of supporting pins 20. The plate 30 in position is shown in FIG. 2 and in plan view in FIG. 3. The plate 30 comprises a plurality of openings 31. The plurality of supporting pins 20 can be positioned within the plurality of openings 31. All of the plurality of supporting pins 20 connected to the surface 11 of the main body 10 have a corresponding opening 31 in the plate 30. In other words, each of the plurality of supporting pins 20 has a corresponding opening 31. Thus, there is an opening 31 in the plate 30 for each supporting pin 20. In this way, the plate 30 can fit around each of the supporting pins 20. Each of the plurality of openings 31 may be formed as a through hole in the plate 30. Thus, each of the plurality of openings 31 may be a circular hole through which a supporting pin 20 may enter. The plate 30 may extend across the whole of the substrate W. The plate 30 may be approximately the same size as the substrate W in plan. The plate 30 may be slightly smaller than the substrate W in plan. The plate 30 can be used to provide a surface beneath most of the substrate W to control the environment below the substrate W.

The plate 30 may be disc shaped. The plate 30 may be substantially circular. The plate 30 may have a thickness of a few millimetres. For example, the plate 30 may be approximately 1-2 mm. The plate 30 may be the same material as the substrate holder 1. For example, the plate 30 may be glass, ceramic, Zerodur, SiC or SiSiC, etc. The plate 30 may be metal. The plurality of openings 31 may be formed by a laser, which may be beneficial in providing accurately shaped openings.

The plate 30 may be moved in a direction which is transverse to the surface 11 of the substrate holder 1 and/or the support surface, i.e. the plate 30 may not be moved parallel to the surface 11 or the support surface. More specifically, the plate 30 is actuatable in a direction along the plurality of supporting pins 20 between the surface 11 of the main body 10 and the support surface. The plate 30 may be actuatable to a preferred position along this direction. The plate 30 can be moved from the surface 11 of the main body 10 towards the support surface, at the distal ends 22 of the plurality of supporting pins 20, or in the opposite direction from the support surface towards the surface 11 of the main body 10. The plate 30 being actuatable in a direction along the plurality of supporting pins 20 may mean that the plate 30 is actuated along the direction of the central longitudinal axis 23 of the supporting pins 20. The direction of movement of the plate 30 may be substantially perpendicular to the surface 11 of the main body 10 and/or the support surface. The plate 30 may be actuated to move up and down in the direction of arrow B shown in FIG. 2, which may be in the Z-direction.

As the plate 30 is actuated in a direction along the plurality of supporting pins 20 between the surface 11 of the main body 10 and the support surface, the distance d between the support surface (formed by the distal ends 22 of the plurality of supporting pins 20) and the plate 30 can be changed.

As described above, during loading of the substrate W on the substrate holder 1, reducing the gap between the substrate W and the substrate holder 1 and/or increasing the flow rate used to clamp substrate W to substrate holder 1 may have a detrimental effect on in-plane deformation of the substrate W. However, a larger gap and/or slower flow rate can reduce the effectiveness of and/or increase the time taken for clamping the substrate W once on the substrate holder 1. Thus, a balance is needed between the impact of in-plane deformation, clamping efficiency and throughput.

Actuating the plate 30 as described above allows the distance d between the plate 30 and the support surface to be controlled and varied. As the substrate W is positioned on the support surface when in use, this means that the distance between the plate 30 and the substrate W can be controlled. This can be advantageous in that the plate 30 can be positioned in a first position for improving or optimising loading of the substrate W onto the substrate holder 1, and the plate 30 can be positioned in a second position for improving or optimising the clamping of the substrate W. For example, the plate 30 can be moved in a direction along the plurality of supporting pins 20 towards the supporting surface after loading the substrate W. This reduces the distance d between the plate 30 and the support surface. This means that clamping may be much more effective and substrates W can be adequately clamped even with very high deformation, and even when using a relatively low extraction flow rate.

The distance d may be the distance between the support surface and a top surface 33 of the plate 30. The top surface 33 of the plate 30 is the surface which faces the substrate W, and is opposite the lower surface 34 of the plate 30, wherein the lower surface 34 of the plate 30 faces the surface 11 of the main body 10. The top surface 33 of the plate 30 is shown as the upper surface in FIG. 2, although it will be understood that the substrate holder 1 may be used in other orientations.

Each of the plurality of openings 31 may be sized to fit only a single supporting pin 20. Ideally, each of the plurality of openings 31 are of a similar size to each of the plurality of supporting pins 20, such that each of the openings 31 is substantially flush with the outside of each of the plurality of supporting pins 20. Thus, in FIG. 3, the plurality of openings 31 are formed around each of the plurality of openings 20, but no gap can be seen around each supporting pin 20 in this figure. The reason that this is beneficial is that the environment above the plate 30 can be more accurately controlled because less fluid leaks from above the plate 30 to below the plate 30.

Ideally, the number of openings 31 in the plate 30 corresponds to the number of supporting pins 20. Although, as will be described below, the plate 30 may additionally comprise at least one extractor portion 32 which includes an opening, and which correspond to other features on the main body 10. However, the extractor portion 32 may be formed in a different way from the plurality of openings 31. For example, the extractor portion 32 may comprise a protrusion with a passage therethrough. Having the same number of openings 31 means that there should be less fluid leaks from above the plate 30 to below the plate 30.

Figure 3:
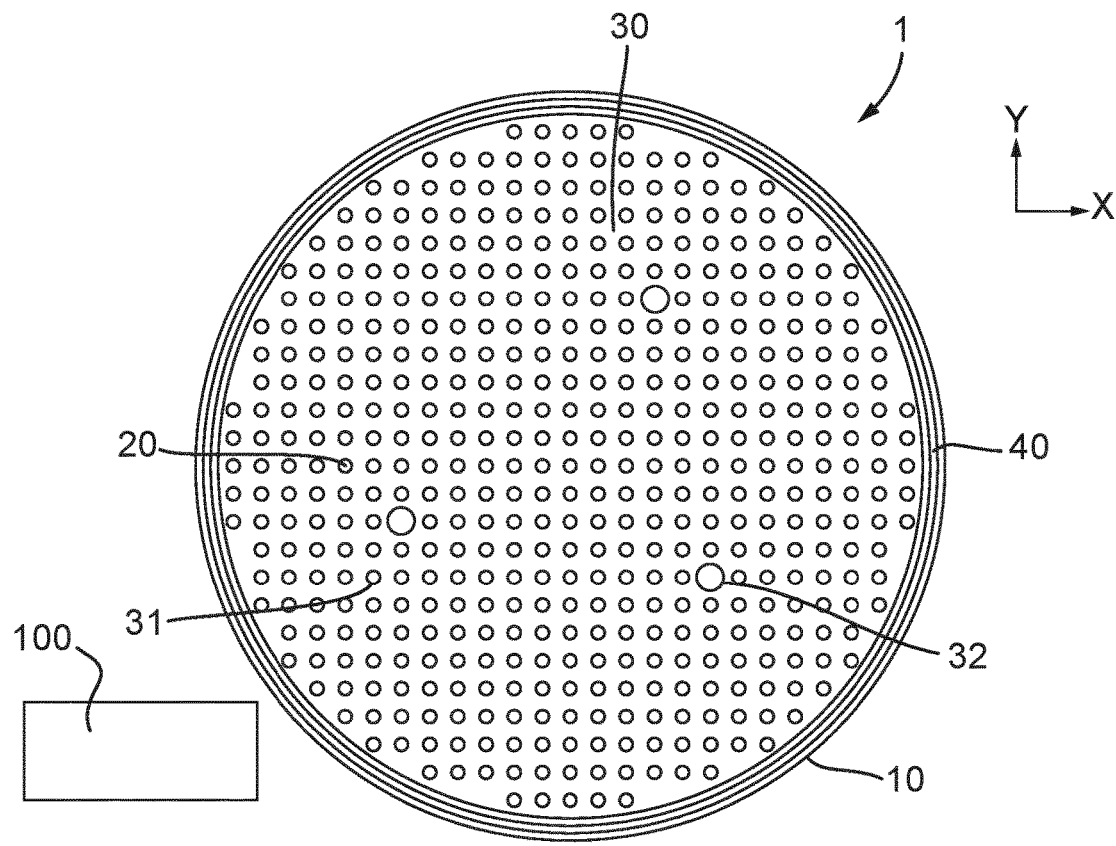
FIG. 3 depicts a plan view of the substrate holder of FIG. 2.

As shown in FIGS. 2 and 3, the plurality of supporting pins 20 may be substantially cylindrical. Generally, it is preferable that a cross-sectional shape of the supporting pins 20 is uniform along the length of the longitudinal axis 23, for example as with the cylindrical supporting pins 20 in FIGS. 2 and 3. This is beneficial because any gap between the plurality of openings 31 and the plurality of supporting pins 20 is substantially constant. This means that gap between the plurality of openings 31 and the plurality of supporting pins 20 can preferably be kept to a minimum to reduce fluid leaking across the plate 30 (i.e. from above the plate 30 to below the plate 30). Preferably the plurality of supporting pins 20 have the same shape as each other.

Figure 4:
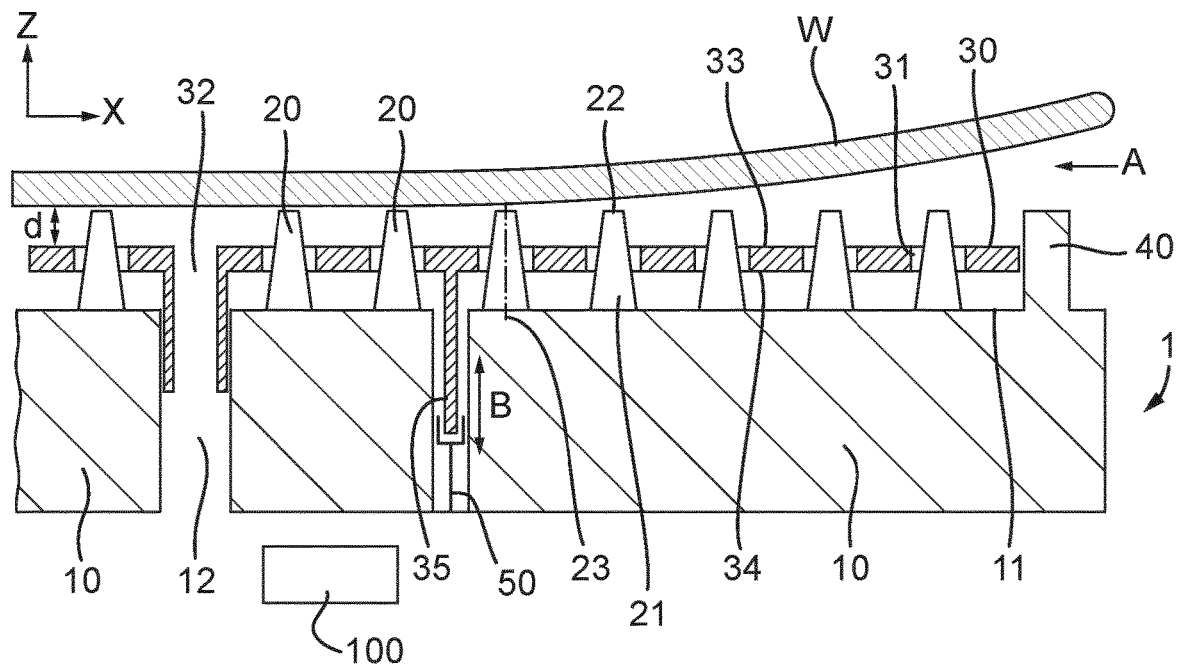
FIG. 4 depicts a variation of the substrate holder of FIGS. 2 and 3.

It will be noted that it is not necessary for the supporting pins to be substantially cylindrical, and other shapes for the supporting pins 20 may be used. It is also not necessary for the cross-sectional shape of the supporting pins to be uniform along the length of the supporting pins. For example, each of the plurality of supporting pins 20 may be frustoconical, i.e. a truncated cone, or may be conical in shape. This is shown in FIG. 4 for example. There may be advantages to using such shapes for the plurality of supporting pins 20. For example, a frustoconical supporting pin 20 may be stronger and thus, have less likelihood of breaking. In FIG. 4, the plurality of openings 31 are shown as having sides which are substantially perpendicular to surfaces of the plate 30. However, the sides of the openings 31 may be slanted to more closely match the shape of the plurality of supporting pins 20. This may be beneficial in reducing the gap between the plurality of supporting pins 20 and the plurality of openings 31 to reduce fluid leaking across the plate 30. Although the supporting pins 20 of FIGS. 5, 6, 7A and 7B are shown as substantially cylindrical, the supporting pins 30 may be any shape, and could be frustoconical as shown in FIG. 4 for example, in combination with any of the features described in relation to FIGS. 5, 6, 7A and/or 7B.

The plurality of supporting pins 20 may be connected to the surface 11 of the main body 10 in any suitable way. The plurality of supporting pins 20 may be separate components which are attached to the surface 11 of the main body 10. Alternatively, the plurality of supporting pins 20 may be integral to the main body 10. In other words, the plurality of supporting pins 20 may be formed as protrusions from the surface 11 of the main body 10, i.e. the plurality of supporting pins 20 may be formed as a single part with the main body 10.

The substrate holder 1 may be configured to extract fluid from between the substrate W supported on the support surface and the plate 30. Fluid at the edge of the substrate W may be drawn under the substrate and may be moved in the direction of arrow A as shown in FIG. 2. As fluid is extracted the pressure beneath the substrate W is reduced relative to pressure above the substrate W, and the edge of the substrate W will lower towards the substrate holder 1. The substrate W can be clamped by extracting fluid in the space below the substrate W to provide a reduced relative pressure in the space between the substrate holder 1 and the substrate W. Providing the plate 30 means that the pressure only needs to be reduced between the plate 30 and the substrate W which is generally a smaller space than between the substrate W and main body 10. The space can be reduced by reducing distance d. Controlling pressure above the plate 30 may be more effectively done if fluid leakage from above the plate 30 to below the plate 30 is reduced or minimised (as mentioned above). Thus, providing the plate 30 (which is positioned closer to the substrate W than the surface 11 of the main body 10) and extracting fluid from the gap between the substrate W and the plate 30 may advantageously provide more effective clamping.

The main body 10 may comprise at least one extraction opening 12 through which the fluid is extracted. The plate 30 may comprise at least one at least one extractor portion 32 through which the fluid is extracted. There may be the same number of extractor portions 32 in the plate 30 as extraction openings 12 in the main body 10. There may be plural extractor portions 32 and extraction openings 12. For example only, there may be three extractor portions 32 as shown in FIG. 3 (although there could be more or less).

The extractor portion 32 may correspond to the extraction opening 12 in the main body 10 of the substrate holder 1. The extractor portion 32 may be aligned with the extraction opening 12. The extractor portion 32 may interact with the at least one extraction opening 12.

The extractor portion 32 may be shaped to sit within the extraction opening 12. The extractor portion 32 may be formed to be flush inside the extraction opening 12. For example, the extraction opening 12 may comprise a hole within the main body 10 and the extractor portion 32 may be formed with a protrusion with a passage therethrough which sits within, and is flush with, the extraction opening 12. For example, the extractor portion 32 may be formed by a hollow cylindrical protrusion which fits within the extraction opening 12 or portion shaped as a cylindrical hole, as shown in FIG. 2. However, this is not necessary and the passage and openings for extraction may be any shape in cross-section, e.g. rectangular, triangular or square. The extraction opening 12 may comprise a protrusion which sits within a through hole forming an extractor portion 32 of the plate 30. In this case, the height of the protrusion forming the extraction opening 12 should be carefully selected, for example, to protrude to a similar height as the support surface, but allowing for a small gap so that a top of the protrusion of the extractor portion 12 does not contact the underside of the substrate W. Various configurations, including those described here can thus be used to extract fluid from above the plate 30 via the extractor portion 32 in the plate 30 and the extraction opening 12 in the main body 10.

It is beneficial to reduce a space between the plate 30 and the main body 10 because an environment above the plate 30 can then be more accurately controlled using the fluid extraction. Thus, as indicated above, it is beneficial to provide only a small gap between the plurality of supporting pins 20 and the plurality of openings 31 as this reduces leakage of flow from above the plate 30 to below the plate 30. Similarly, it is beneficial to provide the extraction opening 32 as being flush within the extractor 12. Similarly, it is beneficial to provide the plate 30 across the whole surface 11 of the main body 10. The plate 30 may be formed to fit snugly within a physical boundary positioned radially outwards of the plate 30. The physical boundary could be formed towards an edge of the main body 10 as shown in FIGS. 2 and 3. The physical boundary could be formed by a fixed sealing member 40. The fixed sealing member 40 may be a wall type protrusion formed around the edge of the main body 10, for example, around the circumference of the main body 10. The fixed sealing member 40 may be formed to provide a seal between the lower side of the substrate W and the substrate holder 1 around the edge of the substrate W. Ideally, gaps formed between the plate 30 and any other part of the substrate holder 1 are kept to a minimum to prevent fluid leaking into the space below the plate 30, but are not so small that movement of the plate 30 is restricted.

Preferably, the plate 30 is substantially flat. This means that the plate 30 can be more easily moved along the plurality of supporting pins 20 and if desirable, can be positioned on the surface 11 of the main body 10. This also means that the plate 30 can be very close to the support surface across the whole of the plate 30. Additionally or alternatively, the plate 30 is substantially parallel to the support surface. This also means that the plate 30 can be very close to the support surface across the whole of the plate 30.

A controller 100 may be provided and used to determine the preferred position of the plate 30. The controller 100 may be separate from the main body 10, for example as shown in FIGS. 1 and 2. However, it will be understood that the controller 100 may be formed as part of, within, or mechanically or electrically coupled to the main body 10. The controller 100 may determine a preferred position of the plate 30 depending on relevant data. The controller 100 could otherwise be referred to as a control unit. The controller 100 may comprise a processor and may be configured to receive relevant data and use said data to control at least one actuator 50 to move the plate 30 to a determined position, i.e. the preferred position.

The preferred position may be determined depending on data relating to a shape of the substrate W on the support surface. The shape of the substrate W may be estimated. The estimated shape of the substrate W may be predicted based on previous measurements taken. For example, measurements may be taken of previously patterned substrates when a particular process or layer is formed. The prediction may be based on the previous measurements, for example, by generating an average shape dependent on these measurement. The shape of the substrate W could be measured using at least one sensor (not depicted in the drawings). Any appropriate sensor and/or system for measuring the shape of the substrate W can be used, such as equipment by MTI Instruments, Inc. for measuring bow and/or warp of a substrate W, e.g. as described on https://www.mtiinstruments.com/applications/wafer-bow-and-warp/. Data relating to the measured shape of the substrate W from the sensor could be provided as feedback to the controller 100 such that the plate 30 is actuated in response to the measured shape. Thus, the position of the plate 30 could be dynamically controlled.

Additionally or alternatively, the preferred position may be determined depending on data relating to a pressure between the substrate W and the surface 11 of the main body 10. More specifically, the data may relate to a pressure in the space between the substrate W and the plate 30. A pressure sensor (not depicted in the drawings) may be used to measure the pressure between the substrate W and the surface 11 of the main body 10, or more specifically, between the substrate W and the plate 30. Various sensors for measuring the pressure in the space below the substrate W are known. For example, a pressure sensor as disclosed in WO 2017/137129 A1, which is hereby incorporated by reference in its entirety, provides an example of a pressure sensor which might be used. Data relating to the pressure measured by the sensor could be provided as feedback to the controller 100 such that the plate 30 is actuated in response to the measured pressure. Thus, the position of the plate 30 could be dynamically controlled.

Additionally or alternatively, the preferred position may be determined depending on data relating to a flow rate of fluid extracted from between the substrate W and the surface 11 of the main body 10, or more specifically, from between the substrate W and the plate 30. A flow rate sensor (not depicted in the drawings) may be used to measure the flow rate of the fluid extracted via the extractor portion 32 and/or the extraction opening 12. Various sensors for measuring the flow rate in the space below the substrate W are known. Data relating to the flow rate measured by the sensor could be provided as feedback to the controller 100 such that the plate 30 is actuated in response to the measured flow rate. Thus, the position of the plate 30 could be dynamically controlled.

The substrate holder 1 may comprise at least one actuator 50 configured to actuate the plate 30. The substrate holder 1 may comprise a plurality of actuators 50 configured to actuate the plate. The plurality of actuators 50 can be provided at locations across the plate 30 to accurately and effectively control the position of the plate 30. Preferably, the substrate holder 1 comprises at least three actuators 50 configured to actuate the plate 30. Providing at least three actuators 50 is beneficial because they can be positioned to reliably support the plate 30. For example, at least three actuators 50 may be provided in a substantially triangular shape in plan view.

The plate 30 may comprises a protrusion 35 which interacts with at least one actuator 50 as shown in FIGS. 2, 4, 5, 6, 7A and 7B. For example, the protrusion 35 may slot into a part of at least one actuator 50 such that the actuator 50 can move the protrusion 35 to change the position of the plate 30. However, this is not necessary, i.e. the plate 30 may not comprise any such protrusion 35. Instead, for example, the at least one actuator 50 may protrude from the surface 11 of the main body 10 and may push the plate 30 in the direction along the plurality of supporting pins 20.

The at least one actuator 50 may be formed from any known actuator which applies the required force to move the plate 30 in the appropriate direction, e.g. up and down in FIG. 2. Any appropriate mechanism or machine may be used. For example only, the at least one actuator 50 may be an electromagnetic linear actuator (as used in E-pin module, a piezo actuator, motorized spindle, pneumatic actuator). The at least one actuator 50 may be configured to provide movement in one direction, corresponding to the direction of movement of the plate 30 along the plurality of supporting pins 20. The at least one actuator 50 may be controlled by the controller 100. The at least one actuator 50 may be small enough to fit substantially within the main body 10 of the substrate holder 1. Although the figures show the actuator 50 positioned in the main body 10, this is not necessary. The actuator 50 could be positioned below the main body 10 and may be positioned to contact and move the plate 30 from below the main body 10. Thus, the actuator 50 may be at least partially, or entirely outside of the main body 10.

The substrate holder 1 may further comprise a movable member 60 as shown in any of FIGS. 5, 6, 7A and 7B. The substrate holder 1 as described in relation to any of FIGS. 5, 6, 7A and 7B may include any or all of the features described in relation to FIGS. 1-4, unless specified otherwise below.

The movable member 60 may surround the plurality of supporting pins 20. The movable member 60 may protrude from the surface 11 of the main body 10. The substrate holder 1 may be configured to move the movable member 60 up and down. The substrate holder 1 may be configured to move the movable member 60 in the same direction as the plate 30, i.e. in the direction along the plurality of supporting pins 20. The direction of movement of the movable member 60 is shown in FIGS. 5, 6, 7A and 7B by the arrow c.

The movable member 60 may be beneficial in controlling the gap at the edge of the substrate W between the substrate W and the substrate holder 1. This can reduce a pressure drop used to clamp the substrate W. This can reduce in-plane deformation in the substrate W as a relatively low fluid extractor rate can be used to provide adequate clamping.

Figure 5:
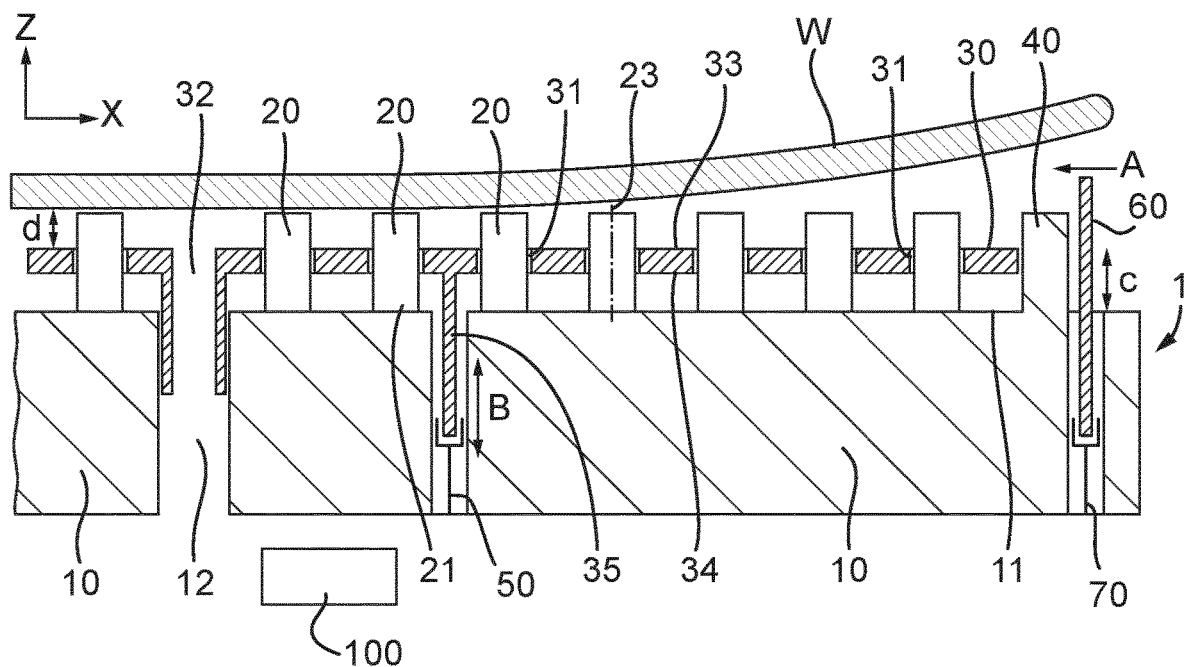
FIG. 5 depicts a variation of the substrate holder of FIGS. 2 and 3.

The movable member 60 may be positioned radially outwards of, an edge of the plate 30. As shown in FIG. 5, the movable member 60 may be provided in addition to the fixed sealing member 40. The movable member 60 may be adjacent to, and radially outwards of, the fixed sealing member 40.

The fixed sealing member 40 may surround the plurality of supporting pins 20. The fixed sealing member 40 may protrude from the surface 11 of the main body 10. The fixed sealing member 40 may be connected to the main body 10 in any way. The fixed sealing member 40 may be integral with the main body 10. The fixed sealing member 40 may be positioned adjacent to, and radially outwards of, an edge of the plate 30. The fixed sealing member 40 may be adjacent to, and radially inwards of, the movable member 60. This is shown in FIG. 5.

The movable member 60 may be used to form a seal with the base of the substrate W in the same way as the fixed sealing member 40. However, the movable member 60 can be moved whereas the fixed sealing member 40 is not configured to move relative to the main body 10. The substrate holder 1 may comprise at least one member actuator 70 configured to move the movable member 60. The substrate holder 1 may comprise a plurality of member actuators 70.

The substrate holder 1 may be configured to move the movable member 60 to a preferred position depending on data relating to one or more of a shape of the substrate W on the support surface, a pressure between the substrate W and the surface 11 of the main body 10 and/or a flow rate of fluid extracted from between the substrate W and the surface 11 of the main body 10, or more particularly, from between the substrate W and the plate 30.

A controller 100 may be provided and used to determine the preferred position of the movable member 60. The controller 100 may be separate from the main body 10, as shown in FIGS. 5, 6, 7A and 7B. However, it will be understood that the controller 100 may alternatively be formed as part of, within, or mechanically or electrically coupled to the main body 10. Specifically, the controller 100 may determine a preferred position of the movable member 60 depending on relevant data. The controller 100 could otherwise be referred to as a control unit. The controller 100 may comprise a processor and may be configured to receive relevant data and use said data to control at least one member actuator 70 to move the movable member 60 to a determined position.

The same controller 100 may be used to determine the preferred position of the movable member 60 and the plate 30, as shown in FIG. 5. Alternatively, a different controller could be used instead, i.e. with one controller being used to determine and control the position of the plate 30, and another controller being used to determine and control the position of the movable member 60. Either way, the controller 100 may determine a preferred position of the movable member 60 depending on relevant data.

As indicated above, the preferred position may be determined depending on data relating to a shape of the substrate W on the support surface. The shape of the substrate W may be estimated. The estimated shape of the substrate W may be predicted based on previous measurements taken. For example, measurements may be taken of previously patterned substrate when a particular process or layer is formed. The prediction may be based on the previous measurements, for example, by generating an average shape dependent on these measurement. The shape of the substrate W could be measured using at least one sensor (not depicted in drawings). Any appropriate sensor and/or system for measuring the shape of the substrate W can be used, such as equipment by MTI Instruments, Inc. for measuring bow and/or warp of a substrate W, e.g. as described on https://www.mtiinstruments.com/applications/wafer-bow-and-warp/. Data relating to the measured shape of the substrate W from the sensor could be provided as feedback to the controller 100 such that the movable member 60 is actuated in response to the measured shape. Thus, the position of the movable member 60 could be dynamically controlled.

Additionally or alternatively, as indicated above, the preferred position may be determined depending on data relating to a pressure between the substrate W and the surface 11 of the main body 10. More specifically, the data may relate to a pressure in the space between the substrate W and the plate 30. A pressure sensor (not depicted in the drawings) may be used to measure the pressure between the substrate W and the surface 11 of the main body 10, or more specifically, between the substrate W and the plate 30. Various sensors for measuring the pressure in the space below the substrate W are known. For example, a pressure sensor as disclosed in WO 2017/137129 A1, which is hereby incorporated by reference in its entirety, provides an example of an appropriate pressure sensor which might be used. Data relating to the pressure measured by the sensor could be provided as feedback to the controller 100 such that the movable member 60 is actuated in response to the measured pressure. Thus, the position of the movable member 60 could be dynamically controlled.

Additionally or alternatively, the preferred position may be determined depending on data relating to a flow rate of fluid extracted from between the substrate W and the surface 11 of the main body 10, or more specifically, from between the substrate W and the plate 30. A flow rate sensor (not depicted in drawings) may be used to measure the flow rate of the fluid extracted via the extractor portion 32 and/or the extraction opening 12. Various sensors for measuring the flow rate in the space below the substrate W are known. Data relating to the flow rate measured by the sensor could be provided as feedback to the controller 100 such that the movable member 60 is actuated in response to the measured flow rate. Thus, the position of the movable member 60 could be dynamically controlled.

Figure 6:
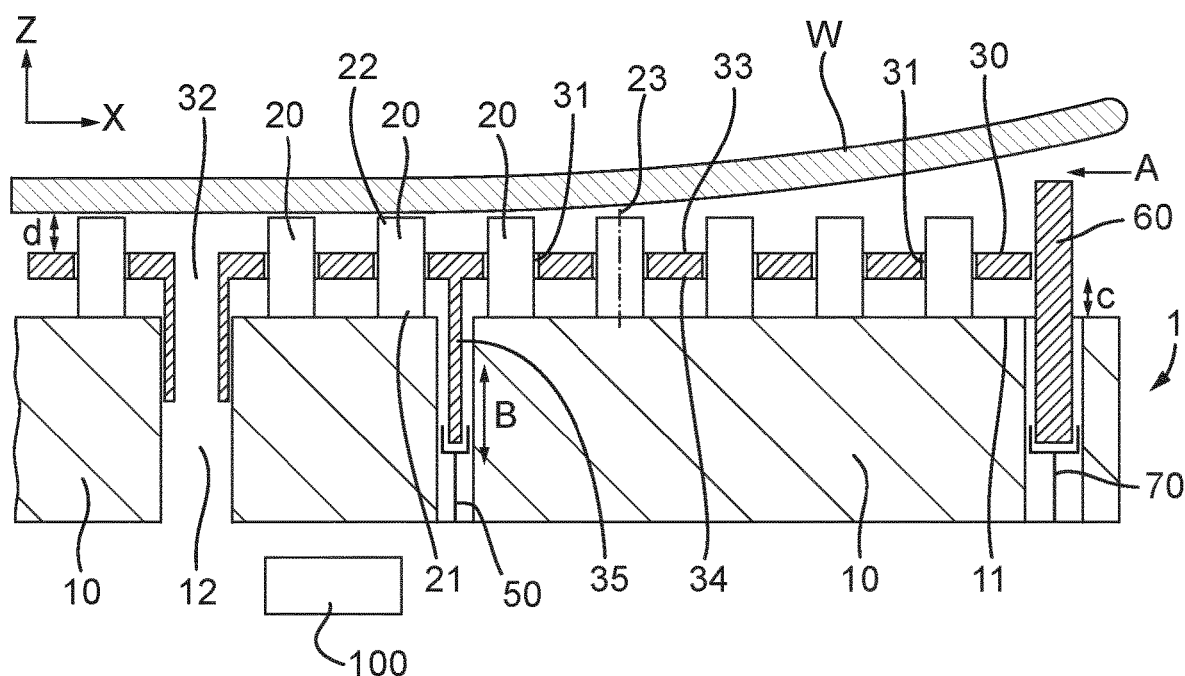
FIG. 6 depicts a variation of the substrate holder of FIGS. 2 and 3.

The at least one member actuator 70 may be formed from any known actuator which applies the required force to move the moveable member 60 in the appropriate direction, e.g. up and down in FIG. 5 or 6. Any appropriate mechanism or machine may be used. For example only, the at least one member actuator 70 may be an electromagnetic linear actuator (as used in E-pin module, a piezo actuator, motorized spindle, pneumatic actuator). The at least one member actuator 70 may be configured to provide movement in one direction, corresponding to the direction of movement of the movable member 60 along the plurality of supporting pins 20. The at least one member actuator 70 may be controlled by the controller as described above. The at least one member actuator 70 may be small enough to fit substantially within the main body 10 of the substrate holder 1. Although the figures show the member actuator 70 positioned in the main body 10, this is not necessary. The member actuator 70 could be positioned below the main body 10 and may be positioned to contact and move the plate 30 from below the main body 10. Thus, the member actuator 70 may be at least partially, or entirely outside of the main body 10.

As shown in FIG. 5, the substrate holder 1 may comprise the movable member 60 and the fixed sealing member 40, with the movable member 60 being radially outwards of the fixed sealing member 40. However, the position of these features could be swapped. Thus, the fixed sealing member 40 could be radially outwards of the movable member 60, such that the movable member 60 is positioned adjacent to, and radially outwards of, an edge of the plate 30, and adjacent to, and radially inwards of, the fixed sealing member 40.

It may be preferable to provide the movable member 60 in combination with the fixed sealing member 40 to provide a better seal around the edge of the substrate W. However, it is not necessary to provide both the moving member 60 and fixed sealing member 40. For example, only the fixed sealing member 40 may be provided as shown in FIGS. 1 and 2. Although this may not provide as effective a seal as the movable member 60, this may provide a lower cost solution which does not require additional actuation and control for the movable member 60. Alternatively, only the movable member 60 may be provided without the fixed sealing member 40 as shown in FIG. 6. The other features of the substrate holder 1 may be as described in relation to FIG. 5 above.

Figure 7A:
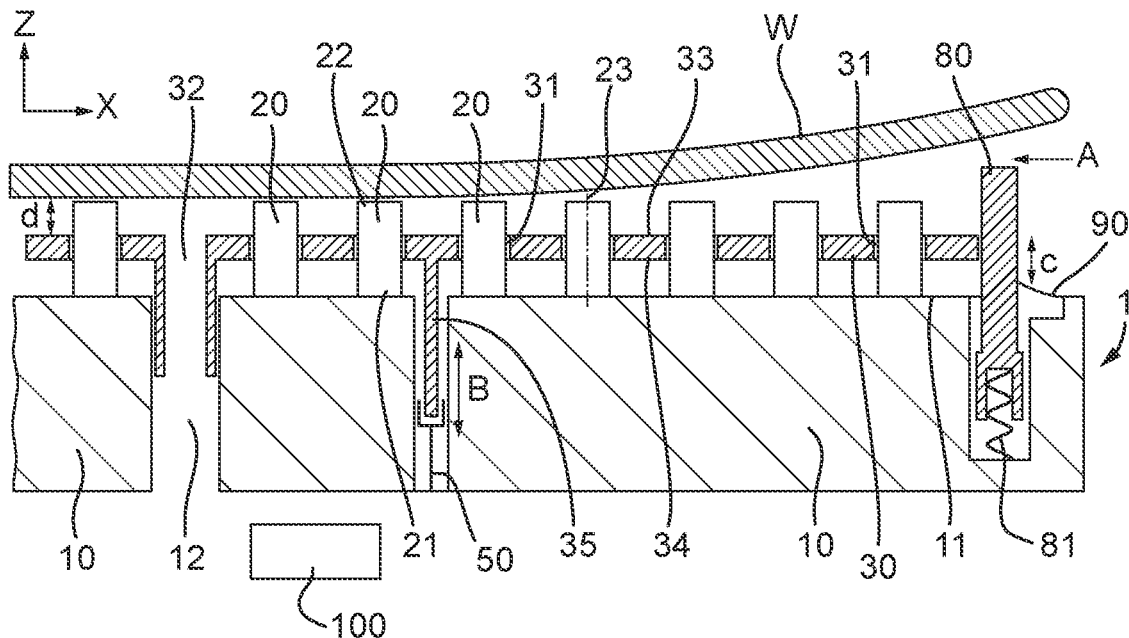
FIGS. 7A and 7B depict a variation of the substrate holder of FIGS. 2 and 3.
Figure 7B:
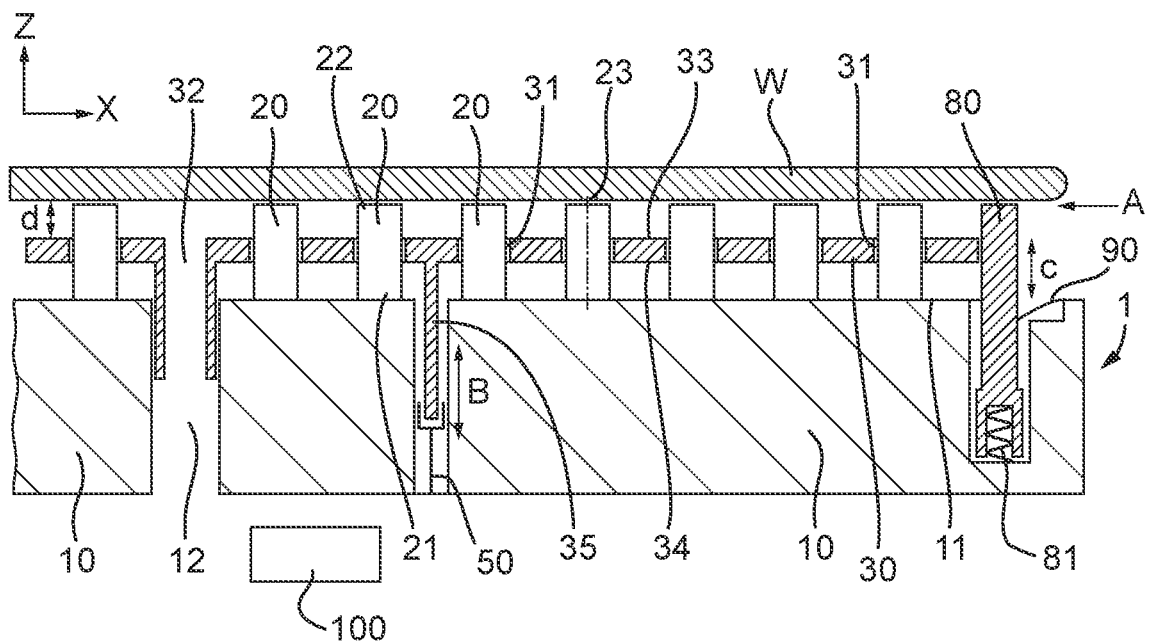

FIGS. 7A and 7B show an example of a movable member 80 being provided. The movable member 80 may be the same as the movable member 60 described in relation to either of FIG. 5 or 6 above. It will be noted that the substrate holder 1 of FIGS. 7A and 7B is provided without a fixed sealing member 40, however, the substrate holder 1 could additionally comprise the fixed sealing member 40 as described in relation to FIGS. 1, 2, and/or 5.

The movable member 80 differs from the movable member 60 described and shown in FIGS. 5 and 6 because no member actuator 70 is used to control the position of the movable member 80. In this instance, a pressure gradient across the movable member 80 may provide a force to move the movable member 80. A flexible seal 90 may be provided which forms a seal between the movable member 80 and the main body 10 of the substrate holder 1. The flexible seal 90 may prevent fluid from outside the space between the substrate W and the substrate holder 1 from getting past the moveable member 80. The flexible seal 90 may keep the movable member 80 substantially in place, whilst allowing the movable member 80 to move in the direction as described above (and shown by arrow c), whilst also preventing fluid from passing around the movable member 80. As shown in FIG. 7A, the fluid flow inwards depicted by arrow A may occur at the start of clamping of the substrate W. During clamping, the pressure below the movable member 80 may change due to the fluid extraction to lead to a pressure gradient in the gap above the movable member 80 resulting in the movable member 80 moving downwards, as shown in FIG. 7B. The moveable member 80 may optionally include a flexible connection between the base of the movable member 80 and the main body 10. For example, a spring 81 as shown in FIGS. 7A and 7B. The flexible connection being for keeping the movable member in position whilst allowing the movable member 80 to move in the direction as described above (and shown by arrow c)

In the first embodiment, a lithographic apparatus may be provided which comprises a substrate holder as in any of the variations described above. The lithographic apparatus may have any of the features described above and/or shown in relation to FIG. 1.

The first embodiment may further provide a method of supporting a substrate W using a substrate holder 1 as in any of the variations described above. The method comprises providing a substrate W on the support surface of the substrate holder 1. The method further comprises obtaining data relating to one or more of a shape of the substrate W on the support surface, a pressure between the substrate W and the surface 11 of the main body 10, and/or a flow rate of fluid extracted from between the substrate W and the surface 11 of the main body 10, and determining a preferred position of the plate 30 between the surface 11 of the main body 10 and the support surface based on the obtained data. This may be done using any of the sensors or controllers described above. Furthermore, the method includes moving the plate 30 in the direction along the plurality of supporting pins 20 to the preferred position and extracting fluid from a space between the plate 30 and the substrate W. Preferably, the steps of the method are carried out in the order described herein.

As described above, when a substrate W is loaded on a substrate holder, the substrate W generally does not land perfectly flat on the substrate holder. This can lead to in-plane deformation which can increase overlay error which may be exacerbated by known clamping techniques. Warped substrates may also lead to various other issues. For example, warpage of the substrate W may create local gaps which are prevented from closing due to stiffness of the substrate W. There are limitations on the suction pressure available which means that a substrate W which is warped in this way may not be effectively clamped.

Substrates which are warped have different shapes and may have specific issues relating to their shape. Clampability of a bowl shaped substrate may be limited by local pneumatic torque being too low to bend the substrate W to get it to roll off the supports. Clampability of a bowl shaped substrate may be limited by vacuum flow leakage to outside the substrate W. Clampability of an umbrella shaped substrate may be limited by large flow leakages at local gaps.

Prior used clamping techniques, especially on bowl-like wafers, generally involve a pressure gradient over a certain distance and over time. This means that local stresses in the substrate W vary over time during the clamping process. This might lead to local variation in virtual slip (hysteresis), depending on friction, and possibly a local inaccuracy in the substrate position. In these prior used clamping techniques, the speed at which the clamping is carried out affects the clamp behaviour and the possible inaccuracy in substrate position.

Clampability using known techniques may be limited in the extent of warpage which can be effectively clamped. For example, known techniques may only be able to clamp a substrate W with bowl shaped warpage of up to 500 µm. However, substrates may have a larger warpage, for example, such as those with 550 µm to 1 mm warpage.

Thus, techniques for clamping of warped substrates could be used to improve at least one of the above identified issues and/or to provide techniques which provide more effective clamping for substrates with higher degrees of warpage, i.e. over 500 µm. A second embodiment provides such techniques.

The second embodiment provides a substrate holder 101 for supporting a substrate W. The substrate holder 101 is configured to support the substrate W. The substrate holder 101 may hold the substrate W in place. The substrate holder 101 may be positioned on, or may be part of the substrate support WT described above, i.e. the substrate holder 101 and the substrate support WT may be made of a single piece. Further to this, the substrate holder 101 may be configured to keep the substrate W in place on the substrate holder 101 in a particular position. For example, the substrate W may be loaded onto the substrate W during loading. The substrate holder 101 may then be configured to keep the substrate W in a fixed position relative to the substrate holder 101. This may otherwise be known as clamping the substrate W.

A partial cross section of a substrate holder 101 according to the second embodiment is shown in FIGS. 8A-8D. Different configurations of the substrate holder 101 are shown in FIGS. 8A-8D as will be described below.

The substrate holder 101 comprises a main body 110 having a surface 111. The main body 110 may form a substantial portion of the substrate holder 101. The surface 111 may be a top surface of the main body 110 when positioned as shown in FIGS. 8A-8D. Thus, the top surface may be an upper surface in the Z-direction as shown. The surface 111 faces the substrate W when the substrate W is supported on the substrate holder 101, i.e. the surface 111 and an underside of the substrate W are facing each other when the substrate W is positioned on the substrate holder 101.

The substrate holder 101 comprises a flexible member 200. The flexible member 200 may be positioned on the surface 111 of the main body 110. The flexible member 200 may protrude from the surface 111 of the main body 110. Specifically, the flexible member 200 may protrude upwards towards the substrate W when in place on the substrate holder 101. In other words, the flexible member 200 may project from the surface 111 of the main body 110. The flexible member 200 may be connected to the main body 110, or more specifically to the surface 111 of the main body 110. The flexible member 200 may be connected to the main body 110 in any appropriate way, for example, using an adhesive. One example for connecting the flexible member 200 is to enclose a bottom part of flexible member 200 in a groove, which would beneficially be relatively straightforward. Another example for connecting the flexible member 200 would be to clamp the flexible member 200 between two protrusions in the main body 110. Another example for connecting the flexible member 200 would be fit the flexible member 200 over a formed part, for example, by fitting the flexible member 200 over hooks, or at least one mushroom-shaped protrusion, or extending the flexible member 200 with any shape that 'hooks' over/into the main body 110. Another example for connecting the flexible member 200 would be to use a wire to sew the flexible membrane 200 onto the main body 110.

The substrate holder 101 comprises a fixed member 140. The fixed member 140 may be positioned on the surface 111 of the main body 110. The fixed member 140 may protrude from the surface 111 of the main body 110. Specifically, the fixed member 140 may protrude upwards towards the substrate W when in place on the substrate holder 101. In other words, the fixed member 140 may project from the surface 111 of the main body 110. The fixed member 140 may be connected to the main body 110, or more specifically to the surface 111 of the main body 110. The fixed member 140 may be connected to the main body 110 in any appropriate way, for example, using an adhesive. The fixed member 140 may be integral with the main body 110. In other words, the fixed member 140 and the main body 110 may be formed of a single piece of material.

The flexible member 200 defines an enclosed cavity 210 therein. Thus, the enclosed cavity 210 is formed within the flexible member 200. The enclosed cavity 210 is in a space defined at least partly by the flexible member 200. The flexible member 200 at least partially surrounds the enclosed cavity 210. Thus, the flexible member 200 forms an internal space, i.e. the enclosed cavity 210, in which the pressure can be controlled as described below.

The flexible member 200 is formed of flexible material. Variations of the pressure within the enclosed cavity 210 affect the forces acting on the material forming the flexible member 200. Thus, variations in pressure in the enclosed cavity 210 may be controlled to vary the shape of the flexible member 200. For example, when the pressure is increased in the enclosed cavity 210, the shape of the flexible member 200 may increase in size, and when the pressure is decreased in the enclosed cavity 210, the shape of the flexible member 200 may decrease in size. The flexible member 200 is shown as being substantially circular in cross-section in FIGS. 8A, 9 and 10. It will be understood that the shape of the flexible member 200 is changed by variation in pressure in the enclosed cavity 210. Also, the shape of the flexible member 200, e.g. when there is ambient pressure in the enclosed cavity 210, is not limiting, as long as the shape of the flexible member 200 can be varied as described below.

The flexible member 200 has a height. In this context, "height" is measured in the direction perpendicular to the surface 111, which may be referred to as the Z-direction. Variations in the size of the flexible member 200 may alter the height of the flexible member 200. For example, as the flexible member 200 increases in size, the height of the flexible member 200 may increase, and as the flexible member 200 decreases in size, the height of the flexible member 200 may decrease.

The fixed member 140 has a height. The fixed member 140 is generally formed of a rigid material. Thus, the shape of the fixed member is generally fixed. Thus, the height of the fixed member 140 does not significantly change.

This means that variations in the pressure within the enclosed cavity 211 can alter the height of the flexible member 200, but the height of the fixed member 140 will stay the same. As explained below, the pressure in the enclosed cavity 211 can thus be controlled to vary the height of the flexible member 200 such that it is greater than the height of the fixed member 140, or smaller than the height of the fixed member 140.

In at least one configuration, the flexible member 200 may be configured to contact the underside of the substrate W when the substrate W is positioned on the substrate holder 101. The flexible member 200 may be configured to form a seal between the substrate holder 101 and the substrate W. Thus, the flexible member 200 may be used to define a space 105 between the substrate W and the main body 110 in which a sealed environment is formed. The seal formed by the flexible member 200 may be used to substantially prevent fluid from passing out of the space 105 past the flexible member 200. Thus, pressure in the space 105 can be controlled by the substrate holder 101.

Figure 8A:
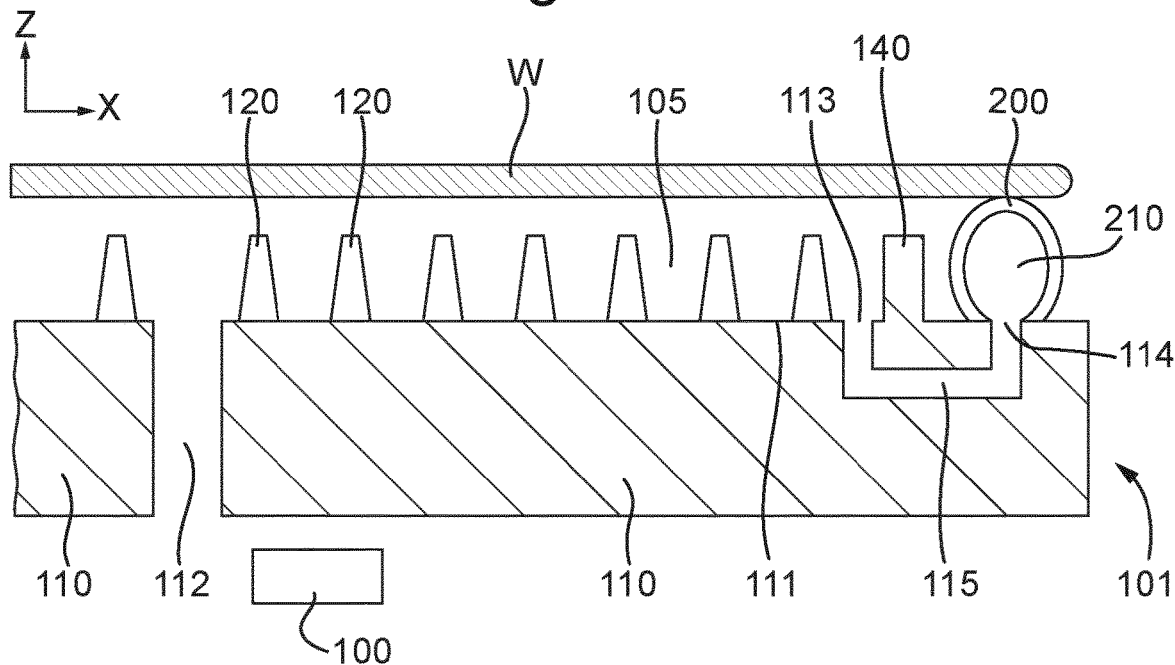
FIGS. 8A, 8B, 8C and 8D depict a cross section of part of a substrate holder according to a second embodiment.

The flexible member 200 may form a seal with the underside of the substrate W in a first state, as depicted in FIG. 8A. The first state may be a configuration in which the substrate W is placed on the substrate holder 101. The first state may be prior to clamping the substrate W on the substrate holder 101. Thus, in the first state, the flexible member 200 may form a seal with the substrate W. However, the pressure in the space 105 formed by the seal may be the same as the pressure outside of the seal, i.e. outside of the space 105 on the other side of the flexible member 200.

During clamping of the substrate W, the substrate holder 101 may be configured to clamp the substrate W to the substrate holder 101. During clamping, the substrate holder 101 may be configured to reduce the pressure in the space 105 to hold the substrate W in place on the main body 110 of the substrate holder 101. Clamping of the substrate W to the substrate holder 101 may be carried out using known techniques, for example using at least one extraction opening 112 through which fluid can be extracted from the space 105, preferably to form a vacuum in the space 105. The at least one extraction opening 112 may be positioned in any appropriate place to remove fluid from the space 105. There may be multiple extraction openings 112. A second state may be a configuration in which the substrate W is being clamped to the substrate holder 101. In other words, the second state is during clamping of the substrate W to the substrate holder 101.

Figure 8B:
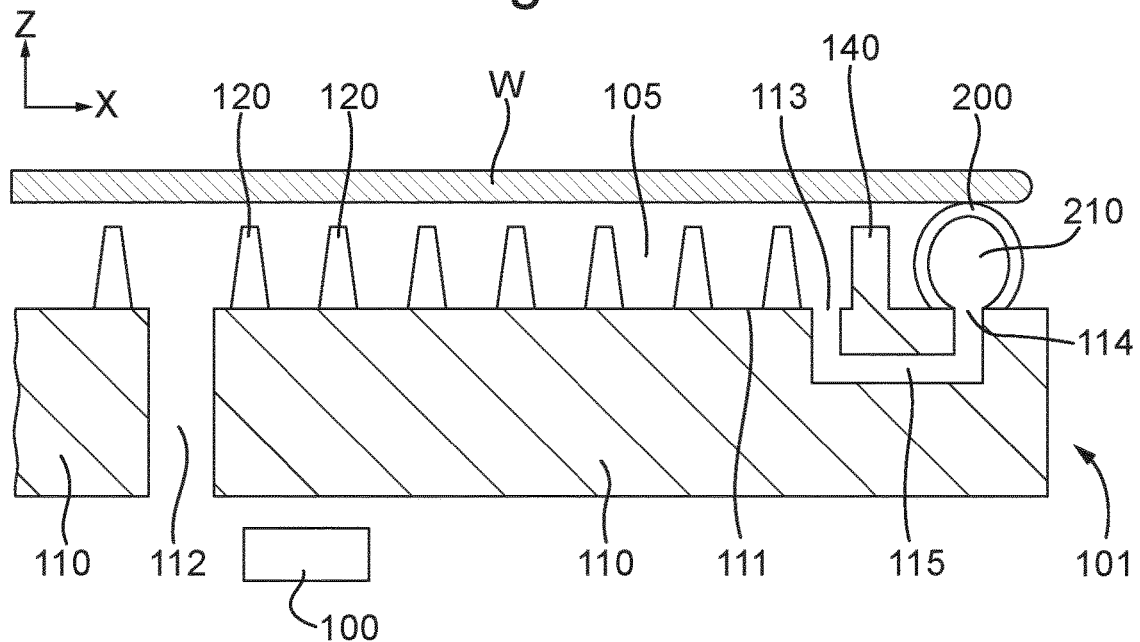
Figure 8C:
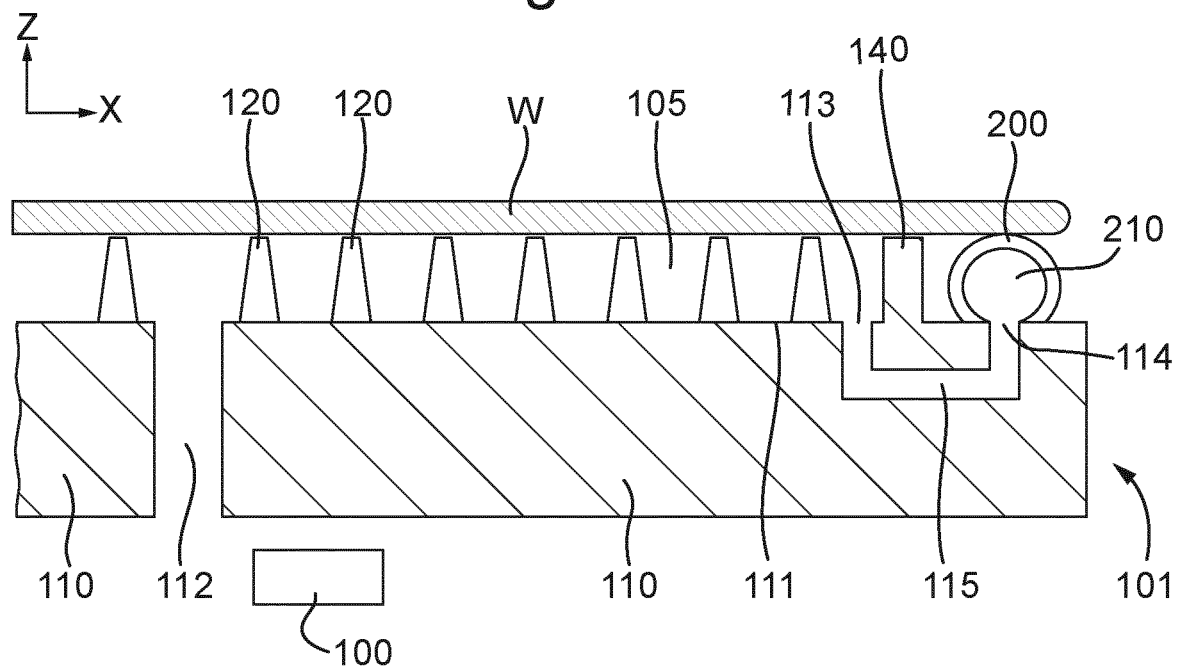
Figure 8D:
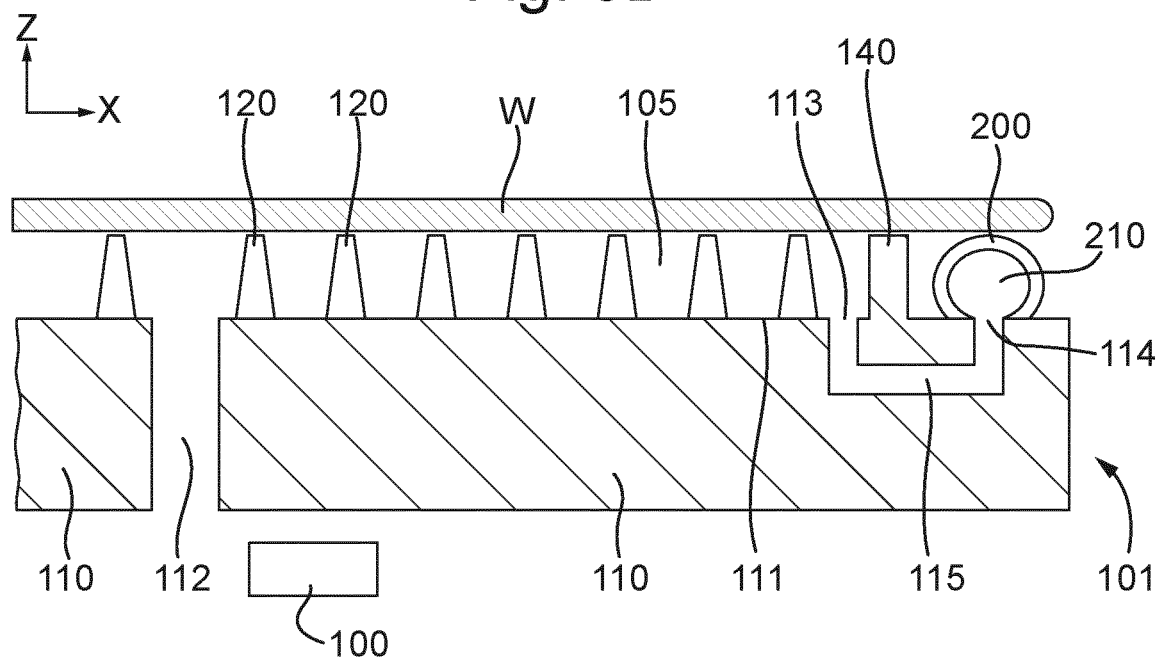

During clamping, i.e. during the second state, the substrate holder 101 may be configured to reduce a pressure in the enclosed cavity 210 of the flexible member 200. The pressure may be reduced such that the substrate W is supported on the substrate holder 101. Configurations showing clamping of the substrate W to the substrate holder 101, i.e. during the second state, are shown in FIGS. 8B, 8C and 8D.

As the pressure is reduced in the enclosed cavity 210, the shape of the flexible member 200 is altered. Specifically, the substrate holder 101 is configured to reduce the pressure in the enclosed cavity 200 to reduce the height of the flexible member 200. Thus, a seal may be formed between the fixed member 140 and the underside of the substrate W in the second state. The seal may be formed between the fixed member 140 and the substrate W due to variation in the height of the flexible member 200.

In the first state, the height of the flexible member 200 may be greater than the height of the fixed member 140, as depicted in FIG. 8A. Thus, in the first state, when the substrate W is placed on the substrate holder 101, the substrate W is supported on the flexible member 200 because it protrudes further from the surface 111 than the fixed member 140. Furthermore, the flexible member 200 may protrude further from the surface 111 than other features of the substrate holder 101. In the first state, the flexible member 200 may protrude further from the surface 111 of the main body 110 than all other components of the substrate holder 101 in an area on which the substrate W is to be placed. In other words, the flexible member 200 may form the highest structure on which the substrate W is to be placed. This means that during the first state, the flexible member 200 contacts the underside of the substrate W and forms a seal with the substrate W.

In the second state, the height of the flexible member 200 changes due to the reduction in pressure in the enclosed cavity 210 therein. The reduction in pressure may lead to a reduction in the height of the flexible member 200. Thus, in the second state, the height of the flexible member 200 may be reduced to equal to, or even less than, the fixed member 140. In other words, in the second state, the height of the fixed member 140 may be greater than or equal to the height of the flexible member 200.

As the height of the flexible member 200 reduces, the substrate W is moved towards the surface 111 of the main body 110. This is shown in FIG. 8B in which the substrate W is closer to the surface 111 than in FIG. 8A. When the height of the flexible member 200 is reduced to a certain extent (due to reduction of pressure in the enclosed cavity 210), a seal is formed between the fixed member 140 and the underside of the substrate W. This configuration is depicted in FIGS. 8C and 8D. As will be noted, the seal formed by the fixed member 140 and the substrate W may not require contact, for example, the fixed member 140 may provide a leaky seal. A leaky seal may be formed when the height of the fixed member 140 is slightly less than a height of the supporting pins 120 which leads to a small gap between a top of the fixed member 140 and the underside of the substrate W when the substrate W is supported on the supporting pins 120. Such a seal will still allow for pressure to be controlled within the space 105.

Figure 9:
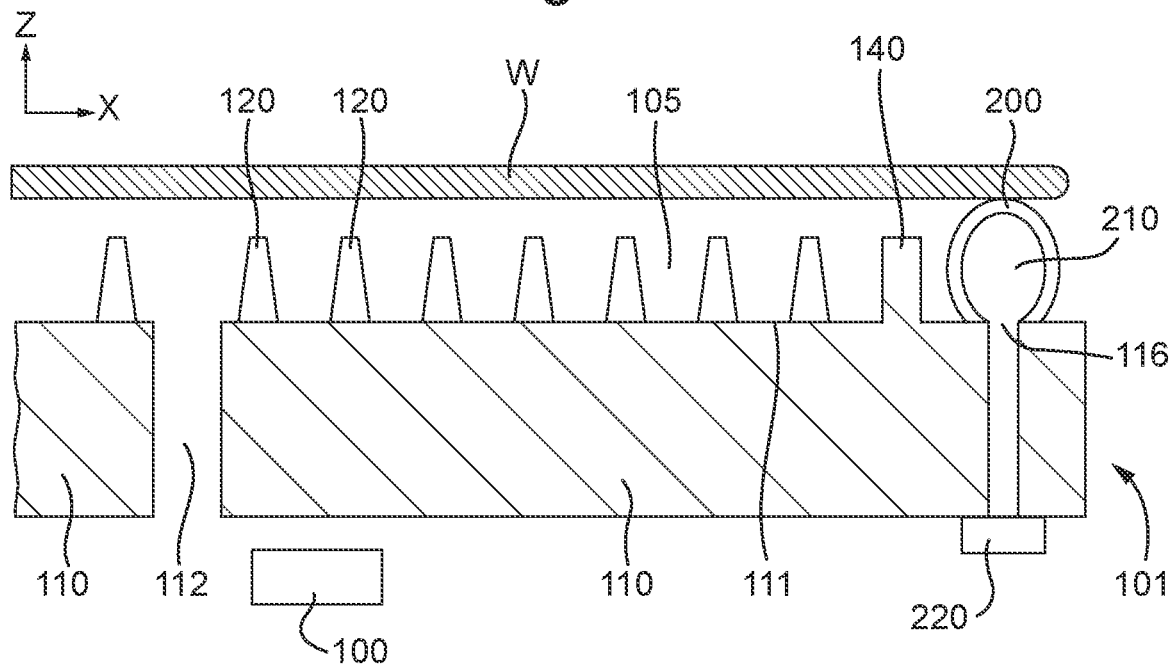
FIG. 9 depicts a variation of the substrate holder of FIGS. 8A-8D.
Figure 10:
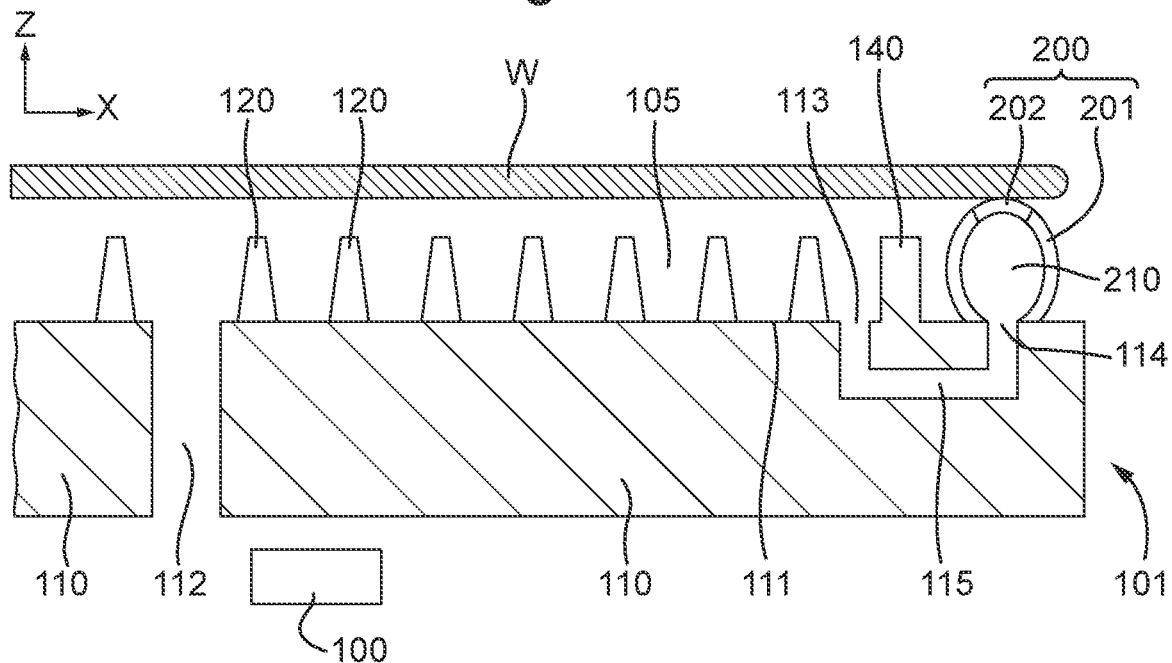
FIG. 10 depicts a variation of the substrate holder of FIGS. 8A-8D.

As indicated, the pressure in the enclosed cavity 210 can be controlled. This pressure may be controlled in a variety of ways. In a first variation for controlling the pressure, which is shown in FIGS. 8A-8D, pressure in the enclosed cavity 210 is controlled by controlling pressure in the space 105. This is due to a fluidic connection between the enclosed cavity 210 and the space 105 (and fluidic isolation from the environment outside the substrate holder 101). In a second variation for controlling the pressure, which is shown in FIG. 9, pressure in the enclosed cavity 210 is separately controlled. This is due to the enclosed cavity 210 being in fluidic isolation from the space 105 and the environment outside the substrate holder 101.

In the first variation for controlling the pressure, the enclosed cavity 210 is in fluidic connection with the space 105 between the substrate W and the main body 110 of the substrate holder 101, as shown in FIGS. 8A-8D. In other words, fluid in the enclosed cavity 210 can move to the space 105 and vice versa. Fluid can be extracted from the space 105 via the extraction opening 112. As fluid is extracted from the space 105, pressure reduces in the space 105. As fluid is extracted from the space 105, fluid is extracted from the enclosed cavity 210 and the pressure also reduces in the enclose cavity 210. As the pressure reduces in the enclosed cavity 210, this reduces the height of the flexible member 200 as discussed above.

In the first variation, the main body 110 may comprise an opening 113 in the surface 111 of the main body 110, as depicted in FIGS. 8A-8D. The opening 113 may be positioned inwards of the fixed member 140. The opening 113 being positioned inwards may mean radially inwards of the fixed member 140 in plan view. The opening 113 being positioned inwards may mean inwards of the fixed member 140 relative to the flexible member 200. In other words, the opening 113 may be positioned on the other side of the fixed member 140 to the flexible member 200. The opening 113 may be positioned on a part of the main body 110 which defines the space 105. The enclosed cavity 210 of the flexible member 200 may be in fluidic connection with the opening 113. This means that fluid can pass from the enclosed cavity 210 to the opening 113.

In the first variation, the main body 110 may comprise a further opening 114 in the surface 111 of the main body 110, as depicted in FIGS. 8A-8D. The further opening 114 may be positioned outwards of the fixed member 140. The further opening 114 being positioned outwards may mean radially outwards of the fixed member 140 in plan view. The further opening 114 being positioned outwards may mean outwards of the fixed member 140 relative to the flexible member 200. In other words, the further opening 114 may be positioned on the same side of the fixed member 140 as the flexible member 200. The further opening 114 may be positioned on a part of the main body 110 which is not in contact with the space 105. The enclosed cavity 210 of the flexible member 200 may be in fluidic connection with the further opening 114. This means that fluid can pass from the enclosed cavity 210 to the further opening 114.

In the first variation, the main body 110 may further comprise a passageway 115 between the opening 113 and the further opening 114. Thus, fluid can pass between the opening 113 and the further opening 114. In this way, fluid can pass between the space 105 and the enclosed cavity 210 via the opening 113, the further opening 114 and the passageway 115. The opening 113, further opening 114 and the passageway 115 may be of any appropriate size to allow passage of fluid as appropriate and to fit with other components of the substrate holder 101. The further opening 114 is shown as being adjacent to the fixed member 140, however, the further opening 114 could be positioned anywhere on the surface 111 which provides fluidic connection with the space 105.

In the first variation, the flexible member 200 may be provided over the further opening 114. Thus, the flexible member 200 may form the enclosed cavity 210 with the further opening 114. The flexible member 200 may be connected to the surface 111 of the main body 110 around or near the further opening 114. The flexible member 200 may be provided over the further opening 114 in a fluid tight manner. The further opening 114 may be the only opening in the enclosed cavity 210. Thus, fluid in the enclosed cavity 210 may only pass in and out of the enclosed cavity 210 via the further opening 114.

Before the substrate W is placed on the substrate holder 101, the surrounding pressure is the ambient pressure (which may be atmospheric pressure or a set pressure, depending on the environment around the substrate holder 101). When the substrate W is placed on the substrate holder 101, the pressure in the space 105 and surrounding the substrate holder 101 is the ambient pressure. This is depicted in FIG. 8A.

During clamping, pressure in the space 105 is reduced, for example, due to removal of fluid from the space 105 via the extraction opening 112. Thus, the pressure in space 105 is less than the ambient pressure outside of the substrate W and the main body 110. A lower pressure can be maintained in the space 105 due to the seal formed between the substrate W and the flexible member 200.

As the pressure in the space 105 reduces, the pressure within the enclosed cavity 210 of the flexible member 200 reduces, which changes the shape of the flexible member 200. As the shape of the flexible member 200 changes, the height of the flexible member 200 is reduced as shown in FIG. 8B, which results in the substrate W moving closer to the main body 110 of the substrate holder 101.

The pressure may be reduced further by extracting additional fluid from the space 105 as shown in FIG. 8C. Thus, the pressure in the space 105 in FIG. 8C is less than the pressure in the space 105 in FIG. 8B. In this case, the pressure also reduces further in the enclosed cavity 210. This further reduction in pressure reduces the height of the flexible member 200, which is shown in FIG. 8C. When the pressure reaches a certain minimum value, the seal between the fixed member 140 and the underside of the substrate W will be formed. In this configuration, a seal is provided by the fixed member 140 to maintain the pressure in the space 105. In this configuration, the height of the flexible member 200 may be substantially equal to, or less than, the height of the fixed member 140.

The pressure in the space 105 may optionally be reduced further. This will further reduce the pressure in the flexible member 200 and further reduce the height of the flexible member 200. In this configuration, the height of the flexible member 200 is less than the height of the fixed member 140, as depicted in FIG. 8D. In this case, the flexible member does not contacts the underside of the substrate W. In this case, the substrate W is supported on the substrate holder 101, and the seal formed by the fixed member 140 maintains the reduced pressure in the space 105.

Although the enclosed cavity 210 is shown in fluidic connection with the space 105 in FIGS. 8A-8D, this is not a necessity. In the second variation for controlling the pressure in the enclosed cavity 210, fluid in the enclosed cavity 210 may not interact with fluid in the space 105. Thus, pressure in the enclosed cavity 210 may be controlled separately from pressure in the space 105. For example, as shown in FIG. 9, the substrate holder 101 may comprise a pressure device 220 configured to control the pressure in the enclosed cavity 210.

In the second variation, opening 116 may be provided in the surface 111 of the main body 110 (and which may correspond to the further opening 114 described above). The flexible member 200 may be provided over the opening 116. Thus, the flexible member 200 may form the enclosed cavity 210 with the opening 116. The flexible member 200 may be connected to the surface 111 of the main body 110 around or near the opening 116. The flexible member 200 may be provided over the opening 116 in a fluid tight manner. The opening 116 may be the only opening in the enclosed cavity 210. Thus, fluid in the enclosed cavity 210 may only pass in and out of the enclosed cavity 210 via the opening 116.

Providing the pressure device 220 may be slightly more complicated than the first variation due to the additional control needed for the pressure device 220. However, advantageously, there is greater design freedom with the second variation because the enclosed cavity 210 is not provided in fluidic connection with the space 105. Specifically, in the first variation, the flexible member 200 should be positioned outwards of the fixed member 140 so that the variation in pressure in the space 105 can be used to vary pressure in the enclosed cavity 210. No such consideration needs to be made for the second variation.

Although a different mechanism is used in the second variation, it will be understood that the pressure in the flexible member 200 may be controlled in a similar way in the second variation and the first variation, to provide a higher pressure to form a seal with the flexible member 200 as in FIG. 8A, and to reduce the pressure in the enclosed cavity 210 to reduce the height of the flexible member 200 as shown in any of FIGS. 8B, 8C and 8D. Any appropriate pressure device 220 may be provided, as long as it can be used to appropriately reduce the pressure within the enclose cavity 210 and provide adequate control of the pressure to vary the flexible member 200 as described in relation to FIGS. 8A-8D.

The fixed member 140 may be positioned adjacent to the flexible member 200. For example, the fixed member 140 may be positioned as protruding from the main body 110 without any other protrusions between the fixed member 140 and the flexible member 200. The distance between the fixed member 140 and the flexible member 200 may be approximately 0.2 mm to 5 mm. As shown in 8A-8D, the shape of the flexible member 200 may change between the first state and the second state, such that a distance of at least 0.2 mm may be useful to ensure that there is no contact between the flexible member 200 and the fixed member 140 to reduce or prevent wear of the flexible member 200. The distance may be larger than 5 mm. However, the distance is preferably approximately 5 mm or less due to the overall size of the substrate holder 101 and other components being provided on the substrate holder 101.

The fixed member 140 may be positioned inwards of the flexible member 200. For example, the fixed member 140 may be positioned inwards of the flexible member 200 relative to the edge of the substrate holder 101. The flexible member 200 may be positioned outwards of the fixed member 140 relative to, for example, a feature and/or the space 105, surrounded by both the fixed member 140 and the flexible member 200, i.e. the fixed member 140 may have a feature on one side and the flexible member 200 on the other side. The fixed member 140 being positioned inwards may mean radially inwards of the flexible member 200 in plan view. The flexible member 200 may be positioned surrounding the fixed member 140. In other words, the flexible member 200 may be positioned around the outside of the fixed member 140, e.g. relative to a feature and/or the space inwards of the fixed member 140. In FIGS. 8A-8D, 9 and 10, the substrate holder 101 is shown with the flexible member 200 as being provided toward an outside edge of the substrate holder 101 and the fixed member 140 being provided inwards of the flexible member 200. Other configurations are also possible. For example, the flexible member 200 may be positioned inwards of the fixed member 140. The flexible member 200 may be positioned inwards of the fixed member 140 relative to the edge of the substrate holder 101. The fixed member 140 may be positioned outwards of the flexible member 200 relative to, for example, a feature and/or the space 105, surrounded by both the fixed member 140 and the flexible member 200, i.e. the flexible member 200 may have a feature on one side and the fixed member 140 on the other side. The flexible member 200 being positioned inwards may mean radially inwards of the fixed member 140 in plan view. The fixed member 140 may be positioned surrounding the flexible member 200. In other words, the fixed member 140 may be positioned around the outside of the flexible member 200, e.g. relative to a feature and/or the space inwards of the flexible member 200.

Although the configurations shown in FIGS. 8A-8D, 9 and 10 show the fixed member 140 and the flexible member 200 positioned around the edge of the substrate holder 101, this is not necessary. The flexible member 140 and the fixed member 200 may be positioned in other locations. The fixed member 140 and the flexible member 200 may be positioned anywhere on the substrate holder 101 to provide the appropriate seal/seals prior to, and during clamping.

Multiple fixed members 140 and flexible members 200 may be provided in different locations. For example a first fixed member 140 and first flexible member 200 may be provided around the edge of the substrate holder 101, and a second fixed member 140 and a second flexible member 200 may be provided around a feature on the substrate holder 101, such as a hole, e.g. for extracting fluid. Additional fixed member(s) 140 and flexible member(s) 200 may also be provided around additional or alternative features.

For example, the substrate holder 101 may comprise at least one hole which may be in fluidic connection with an environment outside the space 105. The at least one hole may be the extraction opening 112. The at least one hole may be provided in which a lifting mechanism is positioned to raise and/or lower the substrate W during clamping. Thus, the flexible member 200 and fixed member 140 may be provided surrounding the at least one hole of the substrate holder 101. The flexible member 200 may surround the fixed member 140 or vice versa. The flexible member 200 may be inwards of the fixed member 140 as described above, meaning that the flexible member 200 is closer to the at least one hole than the fixed member 140. In other words, the fixed member 140 may be positioned surrounding the flexible member 200. Alternatively, the fixed member 140 may be inwards of the flexible member 200 as described above, meaning that the fixed member 140 is closer to the at least one hole. In other words, the flexible member 200 may be positioned surrounding the fixed member 140.

Additionally or alternatively, if a sensor (not depicted in figures) is positioned on the surface 111 of the main body 110, the flexible member 200 and the fixed member 140 may be positioned surrounding the at least one sensor. The flexible member 200 may surround the fixed member 140 or vice versa. The flexible member 200 may be inwards of the fixed member 140 as described above, meaning that the flexible member 200 is closer to the at least one sensor than the fixed member 140. In other words, the fixed member 140 may be positioned surrounding the flexible member 200. Alternatively, the fixed member 140 may be inwards of the flexible member 200 as described above, meaning that the fixed member 140 is closer to the at least one sensor. In other words, the flexible member 200 may be positioned surrounding the fixed member 140.

Additionally or alternatively, as shown in at least FIGS. 8A-8D, the main body 110 comprises supporting pins 120 on the surface of the main body 110. Although the supporting pins 20 of FIGS. 8A-8D, 9 and 10 are shown as substantially frustoconical, the supporting pins 30 may be any shape, and could be cylindrical as shown in at least FIG. 5 of the first embodiment. The flexible member 200 and fixed member 140 may surround the supporting pins 120. In other words, the flexible member 200 and the fixed member 140 may be formed around the supporting pins in plan view, i.e. in a view perpendicular to the x-y plane. The flexible member 200 may surround the fixed member 140 or vice versa. The flexible member 200 may be inwards of the fixed member 140 as described above, meaning that the flexible member 200 is closer to the supporting pins 120 than the fixed member 140. In other words, the fixed member 140 may be positioned surrounding the flexible member 200. Alternatively, the fixed member 140 may be inwards of the flexible member 200 as described above, meaning that the fixed member 140 is closer to the supporting pins 120. In other words, the flexible member 200 may be positioned surrounding the fixed member 140.

Using flexible material for the flexible member 200 means that the flexible member 200 may move in different directions, such as in the X-Y plane. This may be advantageous in allowing the flexible member 200 to move relative to the substrate W as the substrate W is positioned on the substrate holder 101. This might beneficially reduce frictional forces between the substrate W and the substrate holder 101 during loading, and may thus, lead to a reduction in in-plane deformation in the substrate W.

Preferably, the flexible member 200 is made of a material which can maintain its shape when in ambient pressure (which may be atmospheric pressure) as shown in FIG. 8A to support the substrate W. Preferably the material can be elastically deformed to reduce the height of the flexible member 200 as shown in FIGS. 8B-8D. Preferably the material can then return to its original shape when the pressure is returned to ambient pressure as in FIG. 8A. The flexible member 200 may be made of any appropriate material. For example only, the flexible member 200 may comprise thermoplastic, Viton, rubber, and/or metal. The flexible member 200 may be formed of a combination of any of these materials, or at least one of these materials in combination with another material. The flexible member 200 may be formed of a single material. The flexible member may be formed of multiple materials.

Over time there may be wear of the flexible member 200, particularly the part which contacts the substrate W. It will be noted that a proximal portion of the flexible member 200 may be connected to the surface 111 of the main body 110, and a distal portion of the flexible member 200, i.e. a top part in FIGS. 8A-8D, may be configured to contact the underside of the substrate W (in at least the first stage). Thus, at least the distal portion of the flexible member 200, which is the portion of the flexible member 200 which contacts the substrate W, may wear over time.

To reduce or prevent wear, at least a portion of the flexible member 200 may comprise wear resistant material. Preferably, at least the distal portion comprises wear resistant material. In an example, the flexible member 200 may comprise a wear resistant coating. The wear resistant coating may be provided around the whole of an outside surface of the flexible member 200. The wear resistant coating may only be provided on the distal portion of the flexible member 200, or at least the distal portion of the flexible member 200. The wear resistant coating may be formed of any appropriate material. For example only, the wear resistant coating may comprise synthetic diamond, a polyetherimide (PEI) film, a polyetheretherketone (PEEK) film, and/or polytetrafluoroethylene (e.g. Teflon). Additionally or alternatively, the material forming the flexible member 200, or at least part of the flexible member 200, may contain wear resistant material. The wear resistant material may be any appropriate material which is resistant to, or reduces wear. For example only, the wear resistant material may be a thermoplastic, for example polyetherimide (PEI) e.g. static dissipative PEI such as SEMITRON ESD 410 (PEI) BLACK. Other examples include polyetheretherketone (PEEK), alumina, silicon carbide (SiC), and/or stainless steel, e.g. AISI 420. Specifically, the distal portion of the flexible member 200 may be wear resistant. This is shown, for example, in FIG. 10 in which the flexible member 200 comprises a first portion 201 made of a first material and a second portion 202 made of a second material. The first material may be any material or combination of materials comprising a thermoplastic, Viton, rubber, and/or metal as described above. The second material may be any wear resistant material.

A controller 100 may be provided to control the pressure in the flexible member 200. The controller 100 may be used to control extraction of fluid from the at least one extraction opening 112 and/or to control pressure device 220. The controller 100 may be the same controller as described above. Thus, the controller 100 may be used to control any features of the first and/or second embodiment which are present. Alternatively, the controller may be separate from the controller 100. Even if the controller is separate, it may still have the same features as the controller 100 as described above.

Advantages of the second embodiment may include at least, increased warped clampability of substrates W on table-like (wafer handler storage unit burl table, wafer table, substrate table/support, wafer handler temperature stabilisation unit) sub-modules which have sufficient clamp force to maintain a flat substrate W. Providing a seal using the flexible member 200 which helps during clamping, but does not touch the substrate W in the ultimate clamped state if desirable. Providing the flexible member 200 as a wear resistant moveable part that is also flexible. As described, the flexible member 200 and fixed member 140 can be applied in various locations to improve formation of a seal/clamping. In addition to improving clampability, the use of the flexible member 200 and the fixed member 140 as described may allow the clamp vacuum to build up more evenly in time and space, which may be beneficial in reducing the local hysteresis.

It will be understood that there are corresponding features of the first embodiment and the second embodiment. These corresponding features (some, but not all, of which are listed here) may be interchangeable. For example, at least the substrate holder 1 of the first embodiment may be interchangeable with the substrate holder 101 of the second embodiment. For example, at least the extraction opening 12 of the first embodiment may be interchangeable with the at least one extraction opening 112 of the second embodiment. For example, at least the plurality of supporting pins 20 of the first embodiment may be interchangeable with the supporting pins 120 of the second embodiment. For example, at least the fixed sealing member 40 of the first embodiment may be interchangeable with the fixed member 140 of the second embodiment. For example, at least the surface 11 of the first embodiment may be interchangeable with the surface 111 of the second embodiment. For example, at least the main body 10 of the first embodiment may be interchangeable with the main body 110 of the second embodiment.

Figure 11:
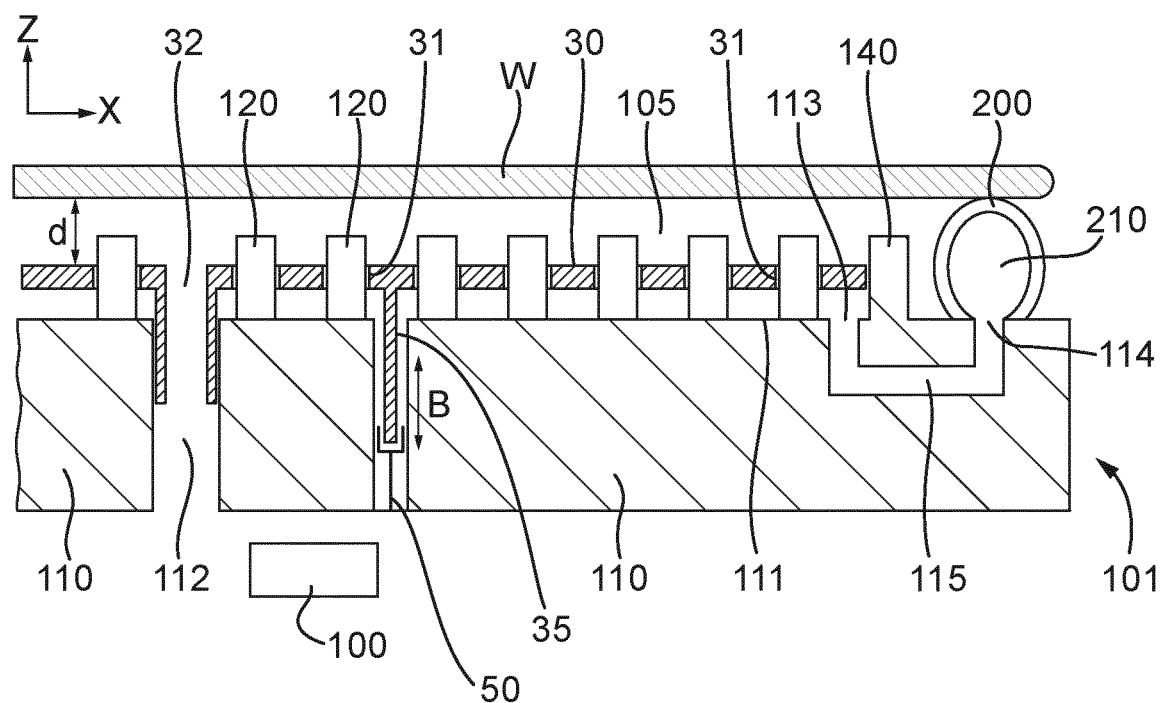
FIG. 11 depicts a variation of the substrate holder according to the first and second embodiments.

The features of the second embodiment may be provided in combination with the features of the first embodiment including any of the variations as described above. For example, the substrate holder 101 of the second embodiment may comprise the plate 30 as described in any of the above variations. FIG. 11 is provided for example only, to show the plate 30 as in FIG. 2 in combination with the substrate holder of FIG. 8A. The supporting pins 120 in FIG. 11 are provided as cylindrical pins out of preference, however, this is not a necessity. The features relating to the plate 30 as shown in any of FIGS. 2-7B may be provided in combination with features relating to the flexible member 200 as shown in any of FIGS. 8A-10.

Similarly, the first embodiment may be provided with any of the features of the second embodiment. It will be noted that the moveable member 60, 80 of the first embodiment may be provided in addition to the flexible member 200 of the second embodiment. Alternatively, the moveable member 60, 80 of the first embodiment may comprise the features of the flexible member 200, such as the enclosed cavity 210.

Thus, in the first embodiment, the movable member 60, 80 may be flexible and define an enclosed cavity 210 therein. The movable member 60, 80 may be configured to form a seal with an underside of the substrate W in a first state (the first state being as described in relation to the second embodiment). The main body 10 of the substrate holder 1 may comprise a fixed member 140 protruding from the surface 11 of the main body 10 and having a height. In a second state (the second state being as described in relation to the second embodiment), the substrate holder 1 is configured to reduce a pressure in the enclosed cavity 210 of the movable member such that the substrate W is supported on the substrate holder 1. In this case, the moveable member 60, 80 and/or substrate holder 1 may comprise any of the other features or variations as described in relation to the second embodiment.

In the second embodiment, a lithographic apparatus may be provided which comprises a substrate holder 101 as in any of the variations of the second embodiment (optionally including any features/variations of the first embodiment) described above. The lithographic apparatus may have any of the features described above in relation to the second embodiment (optionally including any features/variations of the first embodiment) and/or shown in relation to FIG. 1.

The second embodiment may further provide a method of clamping a substrate W to a substrate holder using the substrate holder 101. The method comprising providing the substrate holder 101 as described in any of the variations of the second embodiment. The method further comprises providing the substrate W on the substrate holder 101, wherein the flexible member 200 contacts an underside of the substrate W prior to clamping the substrate W to the substrate holder 101. Clamping the substrate W to the substrate holder 101, for example, by extracting fluid from the at least one extraction opening 112 below the substrate W. The method comprises reducing the pressure in the enclosed cavity 210 of the flexible member 200 during clamping such that the substrate W is supported on the substrate holder 101. Preferably, the steps of the method are carried out in the order described herein.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains one or multiple processed layers.

Although specific reference may have been made above to the use of embodiments of the invention in the context of optical lithography, it will be appreciated that the invention may be used in other applications.

While specific embodiments of the invention have been described above, it will be appreciated that the invention may be practiced otherwise than as described.

The descriptions above are intended to be illustrative, not limiting. Thus, it will be apparent to one skilled in the art that modifications may be made to the invention as described without departing from the scope of the claims set out below.

The invention claimed is:

1. A substrate holder for supporting a substrate, the substrate holder comprising:
   a main body having a surface;
   a plurality of supporting pins connected to the surface of the main body at proximal ends of the plurality of supporting pins, wherein distal ends of the plurality of supporting pins form a support surface for a substrate;
   a plate comprising a plurality of openings, the plate being positioned between the surface of the main body and the support surface; and
   a structure surrounding the plurality of supporting pins and protruding from the surface of the main body, wherein the structure is configured to be movable or flexible in the direction along the plurality of supporting pins,
   wherein all of the plurality of supporting pins connected to the surface of the main body have a corresponding opening of the plurality of openings of the plate, and
   wherein the plate is actuatable in a direction along the plurality of supporting pins between the surface of the main body and the support surface.

2. The substrate holder of claim 1, configured to extract fluid from between the substrate, when supported on the support surface, and the plate.

3. The substrate holder of claim 2, wherein the main body comprises at least one extraction opening for passage of fluid therethrough, and the plate comprises at least one extractor portion for passage of fluid therethrough, an extraction portion of the at least one extractor portion spatially aligning to an extraction opening of the at least one extraction opening.

4. The substrate holder of claim 1, wherein the plate is substantially flat and is substantially parallel to the support surface.

5. The substrate holder of claim 1, wherein the plate is actuatable to a desired position depending on data relating to one or more selected from:
   a shape of the substrate when on the support surface;
   a pressure between the substrate, when supported on the support surface, and the surface of the main body; and/or
   a flow rate of fluid extracted from between the substrate, when supported on the support surface, and the surface of the main body.

6. The substrate holder of claim 1, further comprising a plurality of actuators configured to move the structure, and/or
   wherein the substrate holder is configured to move the structure to a desired position depending on data relating to one or more selected from:
   (i) a shape of the substrate when on the support surface;
   (ii) a pressure between the substrate, when supported on the support surface, and the surface of the main body; and/or
   a flow rate of fluid extracted from between the substrate, when supported on the support surface, and the surface of the main body.

7. The substrate holder of claim 1, wherein the structure is configured to be flexible and defines an enclosed cavity therein, the structure having a height and being configured to form a seal with an underside of the substrate in a first state, and wherein in a second state, the substrate holder is configured to reduce a pressure in the enclosed cavity of the structure such that the substrate is supported on the substrate holder.

8. The substrate holder of claim 7, wherein the substrate holder is configured to reduce the pressure in the enclosed cavity to reduce the height of the structure in the second state, and to form a seal between the underside of the substrate and a fixed structure protruding from the surface of the main body.

9. The substrate holder of claim 7, where the first state is prior to clamping the substrate on the substrate holder and the second state is during clamping the substrate on the substrate holder.

10. The substrate holder of claim 1, wherein the structure is positioned adjacent to, and radially outwards of, an edge of the plate.

11. The substrate holder of claim 1, further comprising a fixed structure surrounding the plurality of supporting pins and protruding from the surface of the main body, wherein the fixed structure is positioned adjacent to, and radially outwards of, an edge of the plate, and adjacent to, and radially inwards of, the structure.

12. A method of supporting a substrate on a substrate holder, the method comprising:
  providing a substrate to the substrate holder, the substrate holder comprising:
    a main body having a surface;
    a plurality of supporting pins connected to the surface of the main body at proximal ends of the plurality of supporting pins, wherein distal ends of the plurality of supporting pins form a support surface for a substrate;
    a plate comprising a plurality of openings, the plate being positioned between the surface of the main body and the support surface; and
    a structure surrounding the plurality of supporting pins and protruding from the surface of the main body, wherein the structure is movable or flexible in a direction along the plurality of supporting pins,
    wherein all of the plurality of supporting pins connected to the surface of the main body have a corresponding opening of the plurality of openings of the plate;
  moving the plate in the direction along the plurality of supporting pins between the surface of the main body and the support surface; and
  extracting fluid from a space between the plate and the substrate.

13. A lithographic apparatus comprising:
  the substrate holder of claim 1; and
  a projection system configured to expose a substrate.

14. The substrate holder of claim 1, further comprising a plurality of actuators configured to actuate the plate.

15. The method of claim 12, wherein the plate is substantially flat and is substantially parallel to the support surface.

16. The method of claim 12, wherein the moving further comprises moving the plate to a desired position depending on data relating to one or more selected from:
  a shape of the substrate on the support surface;
  a pressure between the substrate and the surface of the main body; and/or
  a flow rate of fluid extracted from between the substrate and the surface of the main body.

17. The method of claim 12, further comprising moving the structure to a desired position depending on data relating to one or more selected from:
  (i) a shape of the substrate on the support surface;
  (ii) a pressure between the substrate and the surface of the main body; and/or
  (iii) a flow rate of fluid extracted from between the substrate and the surface of the main body.

18. The method of claim 12, further comprising obtaining data relating to one or more selected from: a shape of the substrate on the support surface, a pressure between the substrate and the surface of the main body, and/or a flow rate of fluid extracted from between the substrate and the surface of the main body and wherein the moving is performed based on the obtained data.

19. A substrate holder for supporting a substrate, the substrate holder comprising:
  a main body having a surface;
  a plurality of supporting pins connected to the surface of the main body at proximal ends of the plurality of supporting pins, wherein distal ends of the plurality of supporting pins form a support surface for a substrate; and
  a plate comprising a plurality of openings, the plate being positioned between the surface of the main body and the support surface, wherein all of the plurality of supporting pins connected to the surface of the main body have a corresponding opening of the plurality of openings of the plate; and
  a controller configured to cause actuation of the plate, after the substrate contacts the support surface, in a direction along the plurality of supporting pins between the surface of the main body and the support surface.

20. The substrate holder of claim 19, further comprising a structure surrounding the plurality of supporting pins and protruding from the surface of the main body, wherein the structure is configured to be movable or flexible in the direction along the plurality of supporting pins.

* * * * *